US006041378A

United States Patent [19]

Warren

[11] Patent Number: 6,041,378

[45] Date of Patent: Mar. 21, 2000

[54] INTEGRATED CIRCUIT DEVICE AND METHOD OF COMMUNICATION THEREWITH

[75] Inventor: Robert Warren, Thornbury, United Kingdom

[73] Assignee: SGS-Thomson Microelectronics Limited, Almondsbury Bristol, United Kingdom

[21] Appl. No.: 08/960,187

[22] Filed: Oct. 29, 1997

[30] Foreign Application Priority Data

Oct. 31, 1996 [GB] United Kingdom .................. 9622685

[51] Int. Cl.[7] .................................................. G06F 11/00

[52] U.S. Cl. .............................................. 710/127; 714/30

[58] Field of Search ................................ 395/307, 800.1, 395/568, 183.01, 183.03–183.07; 710/127; 712/1, 227; 714/25, 27–31

[56] References Cited

U.S. PATENT DOCUMENTS

| | | | |
|---|---|---|---|
| 5,440,705 | 8/1995 | Wang et al. | 711/220 |
| 5,452,432 | 9/1995 | Macachor | 395/842 |
| 5,590,354 | 12/1996 | Klapproth et al. | 395/183.06 |
| 5,596,734 | 1/1997 | Ferra | 395/825 |
| 5,630,048 | 5/1997 | Lajoie et al. | 395/183.01 |
| 5,828,825 | 10/1998 | Eskandari et al. | 395/183.03 |

FOREIGN PATENT DOCUMENTS

| | | | |
|---|---|---|---|
| 0 165 600 | 12/1986 | European Pat. Off. | G06F 13/36 |
| 0 652 516 | 11/1993 | European Pat. Off. | G06F 11/00 |
| 0 636 976 | 2/1995 | European Pat. Off. | G06F 11/00 |
| 0 720 092 | 7/1996 | European Pat. Off. | G01F 11/00 |

OTHER PUBLICATIONS

Standard Search Report dated Feb. 28, 1997.

*Primary Examiner*—Paul R. Myers
*Attorney, Agent, or Firm*—Wolf, Greenfield & Sacks, P.C.; James H. Morris; Theodore E. Galanthay

[57] ABSTRACT

There is disclosed a single chip integrated circuit device including a message converter connected to an on-chip bus system by a first set of pins equal in number to the bit width of the bus system. The message converter has a second set of pins which are less in number than the first set. The message converter has reduced pin data receiving circuitry for receiving messages and data transmit circuitry for formulating messages from information received from the bus system. Each message has a message identifier. There is also disclosed a method of effecting memory access requests using a message converter.

28 Claims, 9 Drawing Sheets

INTEGRATED CIRCUIT DEVICE AND METHOD OF COMMUNICATION THEREWITH

FIELD OF THE INVENTION

This invention relates to an integrated circuit device and a method for effecting communication therewith across the chip boundary.

The invention particularly but not exclusively relates to improving communication for diagnostic purposes. That is, where an integrated circuit includes embedded functional circuitry, for example a processor, it is very difficult using existing diagnostic techniques to provide real time non-intrusive monitoring of the functional circuitry. The functional circuitry need not be a processor, but could be other functional circuitry which could include a DMA (Direct Memory Access) engine or be an on-chip cache.

BACKGROUND OF THE INVENTION

In the past, processors (CPUs) were manufactured as a single chip, requiring off-chip access to all their ancillary circuitry, such as memory. As a result, they had a plurality of access pins so that information about the CPU, in particular memory addressing information, was in any event externally available from these access pins.

In addition to memory addressing information, it is useful to be able to obtain status information about the internal state of the processor to ascertain for example such events as interrupts, changes in streams of instructions, setting of flags in various status registers of the CPU, etc.

Nowadays, chips are more complex and contain not only a processor on-chip but also its associated memory and other ancillary circuitry. Often, there may be more than one processor on a chip, or at least one processor and a DMA (Direct Memory Access) engine or EMI (External Memory Interface) for accessing memory associated with the on-chip processor. Thus, it is no longer a simple matter to monitor the operation of the processor because the signals which are normally available off-chip no longer provide a direct indication as to the internal operation of the CPU(s).

With the increasing complexity of software designed to run on integrated circuit CPUs it is increasingly important to adequately test the software. This requires techniques for monitoring operation of the CPU while it executes the software. It is a particularly onerous requirement that the software be monitored non-intrusively while it is operating in real time.

So-called diagnostic or debugging techniques have been developed in an attempt to achieve this. One existing technique (ICE) involves the manufacture of an emulator board which matches the on-chip hardware and which is connected to it. Thus, the on-chip connections are mapped onto the emulator and are thus accessible on the emulator. However, emulators are complex and expensive to construct and in any event cannot successfully match on-chip communication speeds or conditions. Therefore, it is extremely difficult to truly emulate the on-chip conditions which may prevail.

Another existing technique is to use a logic state analyser (LSA). This is a device connected to the pins of the integrated circuit which monitors continuously the state of all off-chip communications. Each sequentially produced set of states is stored and can then be analysed. Not only is an LSA expensive (although it is less expensive than an emulator), but it requires a large amount of deduction and analysis to derive any useful information from the huge number of sequentially produced state sets which are stored. As it is only possible to analyse the status signals being communicated off-chip, it is inevitably necessary to make some deduction or hypothesis concerning the on-chip situations.

More recently, there have been further developments in an attempt to monitor the operations of "embedded" CPUs. In one integrated circuit, a chain of scan latches is implemented on-chip to transfer data from the registers of the CPU using the on-chip TAP controller. The process is destructive and therefore it is necessary to read data back into the CPU registers before the CPU can continue operating. Thus, in order to implement this it is necessary to stop the CPU so that the status information from its registers can be extracted. This does not therefore satisfy the requirement that the software should be monitored in real time. In some cases, halting the CPU can actually change the way in which the software operates so that a bug which is visible in real time would not be evident if the CPU were halted at that point.

Moreover, the monitoring process is slow because it is necessary to wait for a test scan to be completed to allow all of the scan data from the CPU registers to be transmitted off-chip.

It is therefore an object of the present invention to allow improved diagnostic procedures to be implemented by increasing the facility for external communications off-chip.

Various mechanisms exist to allow an off-chip host processor to share information with, control or communicate with an on-chip target processor or other on-chip functionality. However, these mechanisms have drawbacks which mean that they are not particularly suited to real time or non-intrusive diagnostics.

In one architecture, a common memory bus connects off-chip memory and on-chip memory so that these resources can potentially be shared by the host processor and the target processor. However, this requires a large number of connector pins at the chip boundary to effect the bus connections at the boundary.

Moreover, memory arbitration logic is required according to the sharing schemes permitted in the architecture. Buffering is necessary at the chip boundary, and this can compromise performance or latency. Moreover, such an architecture does not allow for non-intrusive diagnostics, because every access is intrusive.

In another architecture, the off-chip host processor communicates directly with the on-chip target processor by a communication line having a small number of connector pins. However, this requires that the on-chip target processor or other functional circuitry has to be increased to handle the communication requirement so that when in use a performance penalty is incurred. Moreover, the host processor can only access the on-chip memory in the address space of the target processor by causing the target processor to effect such a memory access. Thus, any diagnostic procedures involving memory accesses will inevitably be intrusive.

SUMMARY OF THE INVENTION

According to one aspect of the present invention there is provided a single chip integrated circuit device comprising:

an on-chip target processor;

an on-chip bus system having a first bit width and providing a parallel path between the target processor and a local memory said bus system having address lines, data lines and at least one read/write control line;

a message converter connected to the bus system by a first set of pins equal in number to the bit width of the bus system, the message converter having a second set of pins which are less in number than in the first set of pins;

a communication path connected to the second set of pins for communicating reduced pin data across the chip boundary;

wherein the message converter comprises:

control circuitry connected to the on-chip bus system;

reduced pin data receiving circuitry for receiving messages supplied from off chip via the communication path, decoding a message identifier of each message and causing the control circuitry to operate selectively the address lines, data lines and read/write control line of the bus system in accordance with the message identifier to effect a memory access to the local memory without utilising the on-chip target processor; and data transmit circuitry for formulating messages from information received from the bus system, allocating a message identifier to each message and transmitting messages off-chip in the form of reduced pin data.

The local memory can be on-chip or can be off-chip but connected to the bus system by on-chip memory interface circuitry. However, the local memory is normally within the address space of the target processor and is not normally within the address space of the host. In the absence of a message converter as defined above, the host processor would not be able to effect an access to the local memory.

The bus system can comprise a single read/write control line or separate respective read and write control lines. The bus system can include other control lines such as "valid", "request" and "grant" as appropriate.

The second set of pins can provide a communication path in the direction for the supply of messages from off-chip to on-chip, and in that case there is an auxiliary set of second pins for providing a communication path in the direction for supplying messages from on-chip to off-chip.

Thus, as described in the following, a message converter is provided on the chip which can communicate with a host via a restricted pin count and interprets messages from the host or compiles messages to the host. The message converter can have access to a variety of on-chip resources. Some of the on-chip resources may simply be monitored, others may be controlled or both monitored and controlled. It is a significant advantage that the monitoring of any on-chip resource is non-intrusive and has no impact on the performance or latency of the functionality of the chip. This is ideal for diagnostic purposes.

The message converter of the described embodiment performs the functions of interpretation of received messages, the compilation of transmit messages and the selection or direction of information to/from on-chip functional circuitry, which can include the on-chip target processor. The message converter operates independently of the on-chip functional circuitry and is therefore non-intrusive.

The on-chip functional circuitry can include a set of registers holding information for diagnostic purposes, the diagnostic information being supplied to the message converter via a diagnostic port of the message converter. The registers can include a register holding an instruction pointer of the target processor and/or a register holding data representative of the status of the target processor.

The message converter can additionally have:

i) a memory bus slave port connected to the on-chip bus system for allowing memory accesses initiated by the target processor to remote memory not otherwise in the address space of the target processor;

ii) a memory bus master port connected to the bus system for permitting said memory accesses from off-chip directed at said local memory;

iii) a memory bus monitor port connected to the on-chip bus system for monitoring memory accesses initiated by the target processor.

The message converter can be arranged to formulate the messages from information received by the bus according to a predetermined message protocol in which the message identifier is in the form of an eight bit header with the first two bits of the header identifying whether message is a data write request, data read request, data read response or triggered message. In that event, the message converter comprises decode circuitry for decoding the two bits of the eight bit header to decode the message identifier.

The message converter can include length identification circuitry for identifying from the header the word count of each message. For messages including a memory address in a sequence of data words for loading into the memory address, the message converter can be arranged to decrement the word count on receipt of each word and to increment the address to provide an allocated address in respect of each data word. Thus, it can be arranged to automatically load successive data words into successive address locations.

The invention also contemplates a computer system which comprises a single chip integrated circuit device as defined above;

an off-chip host processor; and an off-chip message converter connected to the off-chip host processor via a parallel bus and connected to the single chip integrated circuit device via the off-chip communication path. The off-chip message converter performs substantially the same functions as the message converter on chip, and could in fact be implemented within the host processor itself.

For the purposes of performing diagnostic operations, there are not so many physical limitations imposed on the external host processor as on the embedded target processor. Therefore, the host processor can incorporate greater functionality as required.

By using the message converters, the off-chip communication path is such that the off-chip processor can be selectively connected without interfering with the continued normal operation of the target processor. This is referred to as so-called hot insertion.

According to another aspect of the present invention there is provided a method of effecting memory access requests made by an off-chip host processor to target memory accessible by an on-chip bus system but normally lying outside the address space of the host processor, wherein:

a) the host processor formulates a memory access message including a message identifier denoting the nature of the message as a memory read and transmits the message to an on-chip message converter connected to the on-chip bus system;

b) the message converter receives the message, decodes the message identifier and effects a memory read request to the target memory, the message converter also modifying the message identifier to decode a memory response and transmitting the message identifier to the host processor with a word count including the number of data words to follow; and c) the message converter subsequently transmits data words read from said target memory to the host processor in accordance with the word count.

Conversely, when used to effect memory access requests from on-chip functional circuitry connected to said on-chip bus system to remote memory normally lying outside the address space of the on-chip functional circuitry and within the address space of the host processor, wherein a memory access request initiated by the on-chip functional circuitry is supplied to the message converter which formulates therefrom a memory access message including a message identifier denoting the nature of the message, the message being transmitted to the off-chip host processor which decodes the message identifier and effects a memory access to its remote memory and returns a memory response including data words read from said remote memory to said on-chip message converter.

Once the message converter has supplied a memory access request message off-chip, it is free to handle subsequent messages or requests. Only the on-chip functional circuitry is held up while it waits for a response to its memory access request.

In the preferred embodiment, the method includes the step of monitoring the status of the on-chip functional circuitry without affecting its operation for determining a trigger condition and for returning a triggered message to the host processor indicating that the trigger condition has been reached.

The host processor and target processor can be synchronised by the target processor dispatching a data read request accessing a memory location in the remote memory of the host and awaiting a data read response prior to the target processor commencing further operations.

In the preferred embodiment, the present invention provides the following features which are particularly useful for implementing diagnostic procedures.

1. Independent hardware (in the form of a message converter) with private link from a host processor to support real time diagnostics.

2. Access to target memory and diagnostic registers from the host processor.

3. Access to diagnostic facilities from the target processor.

4. Access to host memory from target.

5. Control of target processor and sub-systems including the facility to boot the target processor from the host.

BRIEF DESCRIPTION OF THE DRAWINGS

For a better understanding of the present invention and to show how the same may be carried into effect, reference will now be made by way of example to the accompanying drawings.

DESCRIPTION OF THE PREFERRED EMBODIMENT

Figure 1:
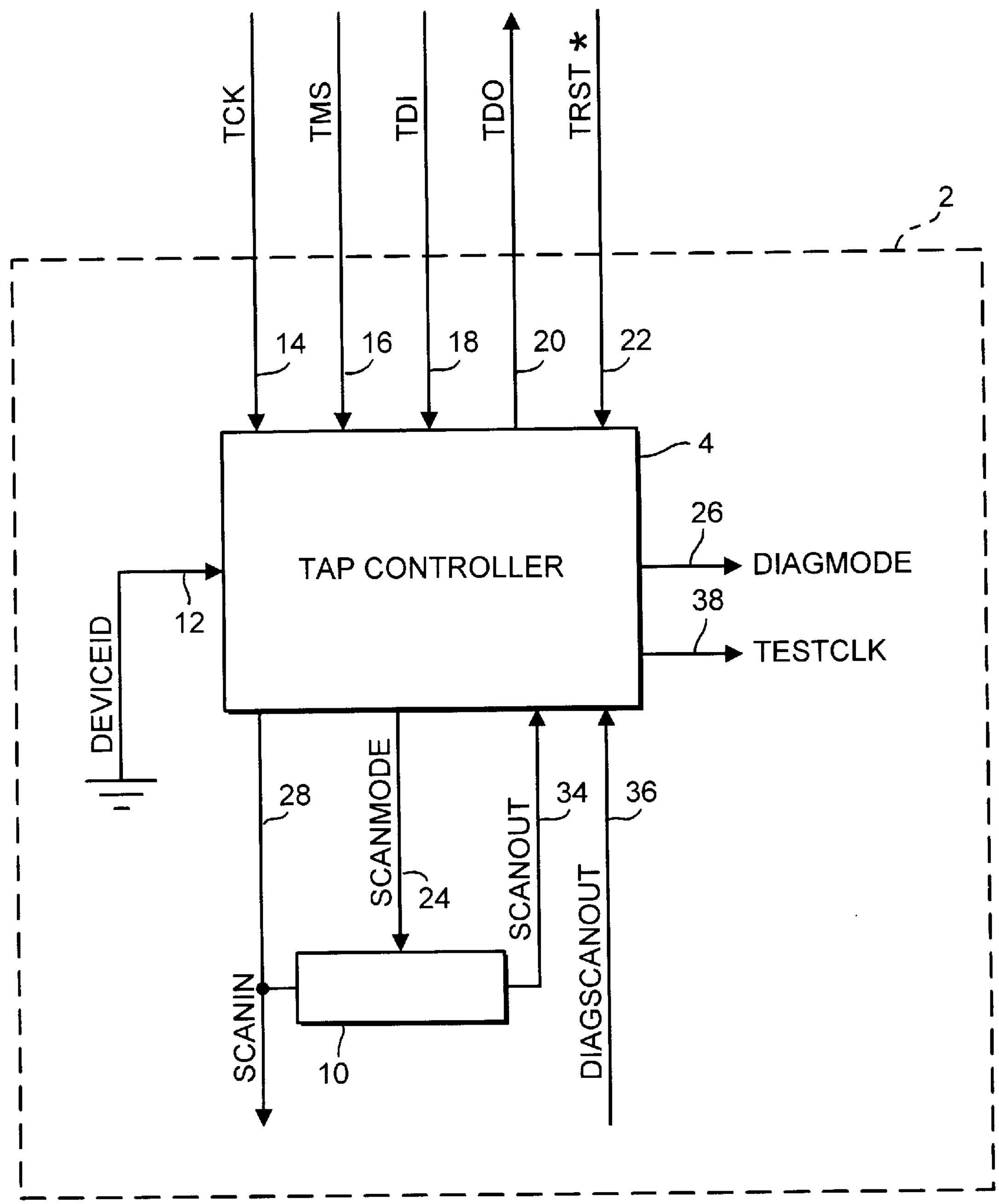
FIG. 1 illustrates an integrated circuit with a test access port controller having connections according to the described embodiment.

FIG. 1 illustrates schematically an integrated circuit 2 including a test access port (TAP) controller 4, and a chip boundary scan chain 10. The TAP controller 4 receives from off-chip a test clock signal TCK on line 14, a test mode select signal TMS on line 16, a test data input signal TDI on line 18, and a test reset input TRST* on line 22. The TAP controller 4 outputs off-chip a test data output signal TDO on line 20. The TAP controller 4 also receives a device identifier signal DEVICEID on line 12. In FIG. 1, the signal DEVICEID is shown as a signal line 12 connected, within the integrated circuit, to ground. The signal line 12 could be a multi-bit wire, and the signal DEVICEID could originate from either on the integrated circuit or off-chip. If the line 12 is a multi-bit wire, then each bit may be connected either to a logic low level or a logic high level on chip. The TAP controller 4 outputs to on-chip circuitry a scan data input signal SCANIN on line 28, a test clock signal TESTCLK on line 38, a signal indicating selection of a scan test mode SCANMODE on line 24, and a signal indicating selection of a diagnostic mode DIAGMODE on line 26. The chip boundary scan chain 10 receives as inputs the scan data input signal SCANIN on line 28 and the signal SCANMODE on line 24, and outputs a scan data output SCANOUT on line 34 to the TAP controller 4. The signal SCANIN on line 28 also is connected to on-chip source/destination logic for diagnostic purposes according to the present invention and will be described hereafter. The source/destination logic provides an input signal DIAGSCANOUT to the TAP controller 4 on line 36 according to the present invention.

Figure 5:
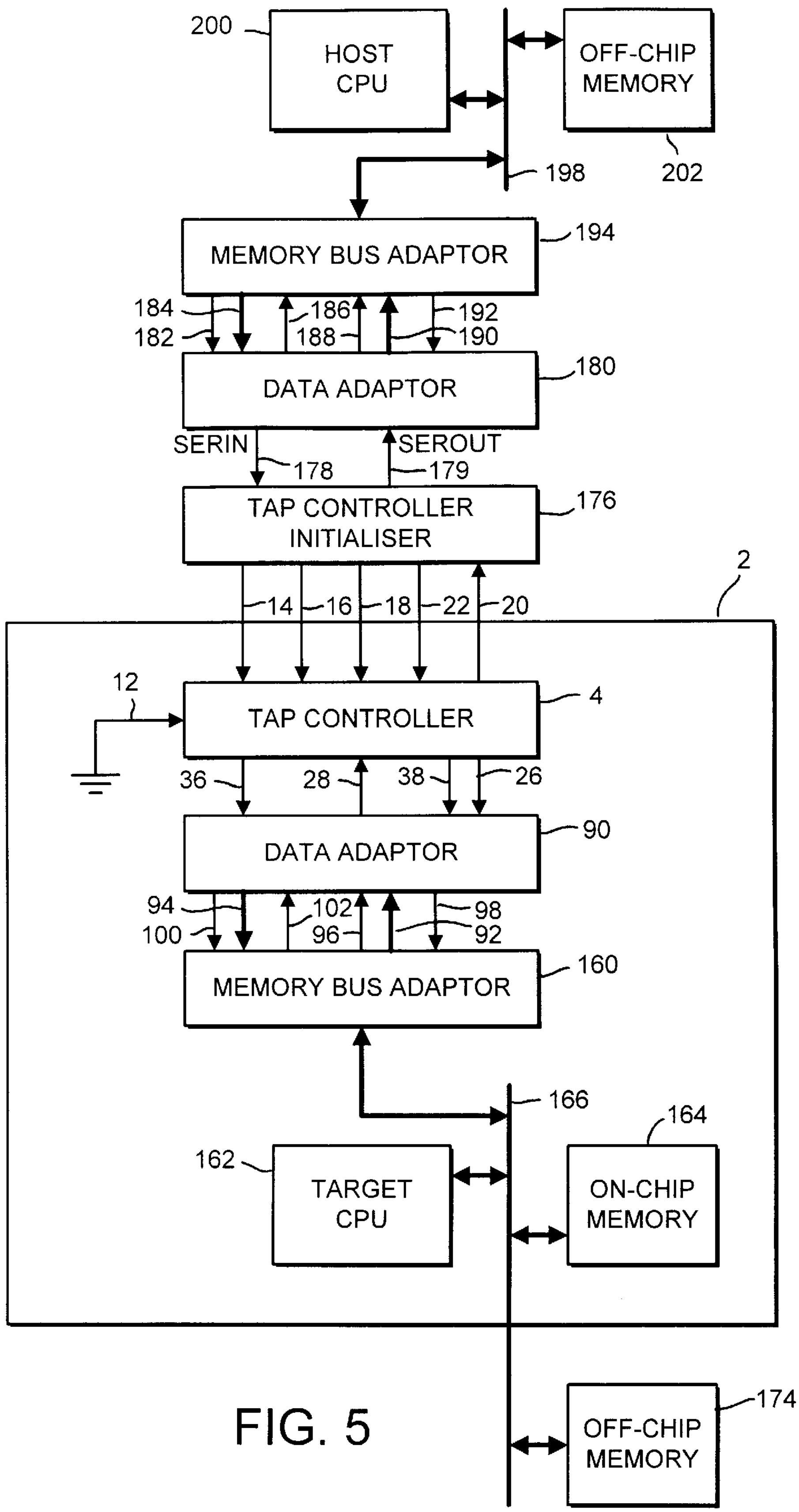
FIG. 5 illustrates in block diagram hierarchical form an implementation of the data adaptor of FIG. 3.

FIG. 5, described in detail hereinbelow, illustrates the components that may constitute the source/destination logic. The source/destination may at least be a processor connected to an on-chip bus system having on-chip memory connected thereto. Off-chip memory may also be connected directly to such a bus system. The on-chip destination/source logic may also include other functional circuitry with a DMA engine or EMI interface.

Figure 2:
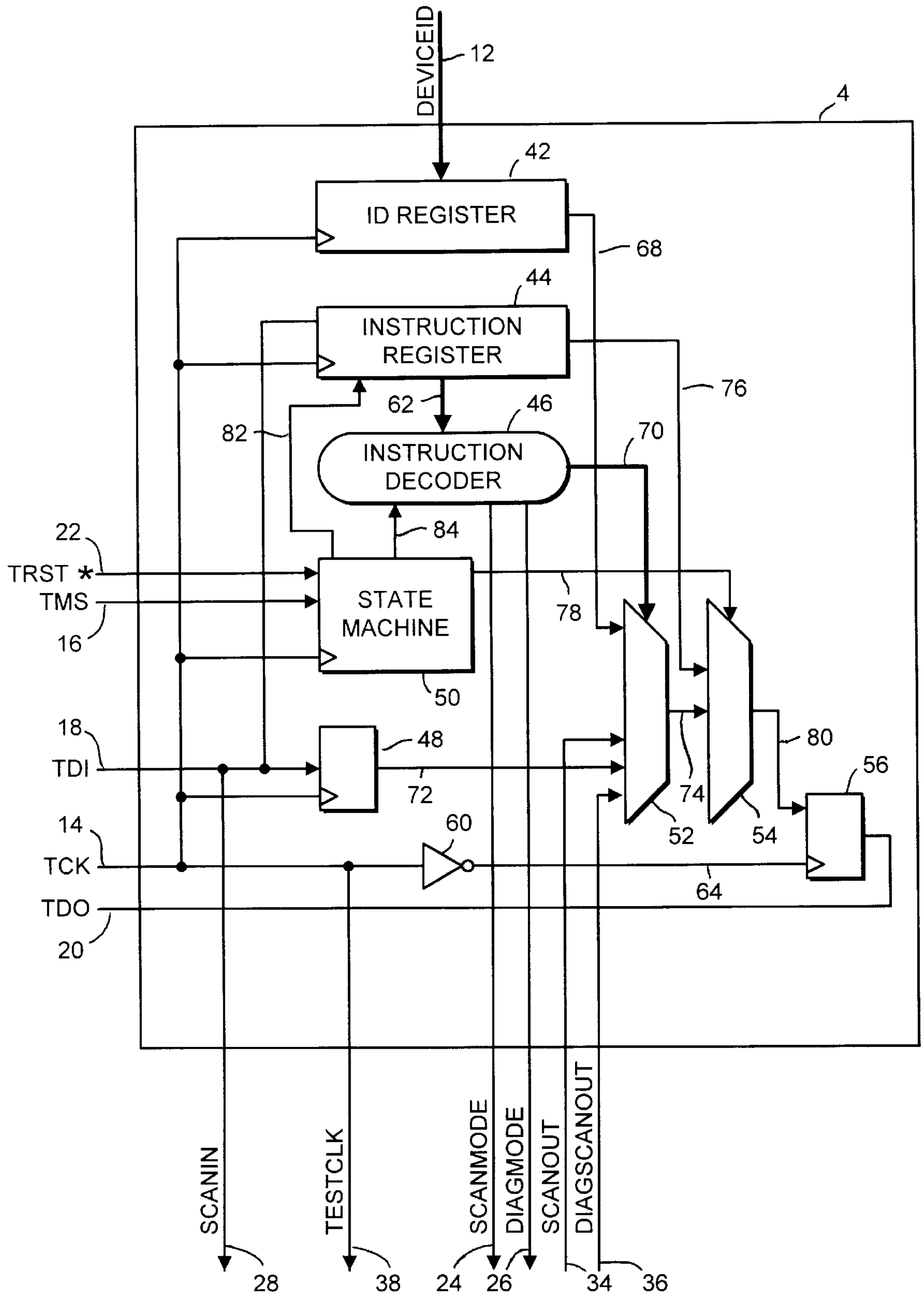
FIG. 2 illustrates the test access port controller of FIG. 1.

The TAP controller 4 is illustrated schematically in FIG. 2 with those circuit blocks essential to its standard operation and as required by the present invention. Referring to FIG. 2, the TAP controller 4, in basic form, comprises a state machine 50, an ID register 42, an instruction register 44, an instruction decoder 46, a bypass latch 48, a data multiplexor 52, an instruction/data multiplexor 54, a latch 56, and an inverter 60. The instruction register receives the test data input signal TDI on line 18, generates a parallel instruction on bus 62 and a serial output on line 76, and receives an instruction control input on line 82. The instruction decoder 46 receives the parallel instruction on bus 62 and a decoder control input on line 84, and generates the signals SCANMODE and DIAGMODE on lines 24 and 26 respectively, and a parallel data multiplexor select signal on line 70. The bypass latch 48 receives the test data input signal TDI on line 18 and generates an output on line 72. The ID register 42 receives the parallel signal DEVICEID on line 12 and generates a serial device identifier output on line 68. The data multiplexor 52 receives the output of the ID register 42 on line 68, the output of the bypass latch 48 on line 72, the SCANOUT signal on line 34, the DIAGSCANOUT signal on line 36 and the data multiplexor select signal on line 70. The data multiplexor 52 generates an output on line 74. The instruction/data multiplexor 54 receives the serial output on line 76, the output of the data multiplexor on line 74, and an instruction/data multiplexor select signal on line 78. The instruction/data multiplexor generates an output on line 80. The latch 56 receives the output of the instruction/data multiplexor 54 on line 80 and generates the test data output signal TDO on line 20. The state machine 50 receives the signal TMS on line 16, and the signal TRST* on line 22. The state machine generates the instruction/data multiplexor select signal on line 78, the instruction control input on line 82, and the decoder control input on line 84. The ID register 42, the instruction register 44, the instruction decoder 46, the bypass latch 48, the state machine 50, and the data converter 57 each receive the test clock signal TCK on line 14. The latch 56 receives the test clock signal TCK inverted via inverter 60 on line 64. The test clock signal TCK and the test data input signal TDI are connected directly as outputs TESTCLK on line 38 and SCANIN on line 28 respectively.

The operation of the TAP controller 4 in performing tests of the integrated circuit 2 is fully explained in IEEE 1149.1-1990. In essence finite length scan chains are formed on the integrated circuit such as that formed by chip boundary scan chain 10.

The TAP controller 4 is a synchronous finite state machine defined by IEEE Standard 1149.1-1990. IEEE Standard 1149.1-1990 defines test logic which can be included in an integrated circuit to provide standardised approaches to testing the interconnections between integrated circuits, testing the integrated circuit itself, and observing or modifying circuit activity during the integrated circuit's normal operation.

During normal operation of the integrated circuit 2, the TAP controller 2 is in a reset state, and all its inputs and outputs are inactive. When a test using the test access port according to IEEE Standard 1149.1-1990 is to be performed, the test access port controller operates according to the definitions of that standard. In such a test mode the test access port controller must be able to select at least one test mode of operation. One possible test mode is a scan test mode, which would be selected by setting the signal SCANMODE on line 24. In the scan test mode a scan chain on the integrated circuit 2 is selected for testing. In this example the chip boundary scan chain 10 is selected by the signal SCANMODE. Such a scan test may simply involve inputting data in at one end of the scan chain, and checking to see that the same data is output at the other end of the scan chain. Alternatively more complex scan operations may be performed, such as scanning in data which is input to functional logic on-chip, functionally clocking the chip for one or more clock cycles, and then scanning out the outputs of the functional logic. Any connection points or circuitry on-chip may be connected for test purposes to form a scan chain. The chip boundary scan chain 10 may be a series of flip-flops which are controlled in test mode to connect all the input/output ports of the integrated circuit 2. A full appreciation of such scan testing can be gathered from reference to IEEE Standard 1149.1-1990. For specific examples of how scan testing may be performed, reference should be made to European Patent Application Publication Nos. 0698890, 0702239, 0702240, 0702241, 0702242, 0702243, 0709688.

A characteristic of known test modes using the test access port of IEEE Standard 1149.1-1990 is that the scan chain is of finite length or closed loop, and that the test data output signal TDO is dependent on the test data input signal TDI, and has a time relationship therewith.

In the described embodiment, the diagnostic mode of operation is provided for carrying out diagnostic procedures of source/destination logic on-chip, which is compatible with IEEE Standard 1149.1-1990. In such a diagnostic test mode, the test data output signal TDO is not dependent on the test data input signal and does not have a time relationship therewith. The chain between the test data input signal TDI and the test data output signal TDO is considered to be of infinite length, or open loop. In the diagnostic mode the TAP controller, whilst continuing to provide all normal functionality, additionally acts as a transport agent carrying full duplex, flow-controlled, unbounded, serial data, although the TAP controller is unaware that this is the form of the data. Conversely the TAP controller normally handles a single stream of data, without any flow control, passing through a selected scan chain.

An overview of the operation of the TAP controller 4 in a test mode will now be given with reference to FIGS. 1 and 2. It should be pointed out that although in FIG. 2 it is shown that the signal SCANIN is connected directly to the test data input signal TDI. In certain circumstances SCANIN may be a modified version of TDI. Similarly although the test clock signal TESTCLK is connected directly to the test clock signal TCK, the signal TESTCLK may in certain circumstances be required to be a modified version of the signal TCK.

In a test mode of operation, the test data input signal TDI and the test mode select signal TMS are supplied in serial fashion to the TAP controller 4 under control of the test clock signal TCK. The state machine 50 acts upon the value of the test mode select signal TMS on each active edge of the test clock signal TCK to cycle through its states accordingly as defined by IEEE Standard 1149.1-1990. The test reset signal TRST* provides for asynchronous initialisation of the TAP controller 4 when in a low logic state in accordance with IEEE Standard 1149.1-1990.

The instruction register 44 is clocked by the test clock signal TCK to load an instruction in serial fashion from the test data input signal TDI under the control of the instruction control input signal on line 82 from the state machine 50. When the instruction has been serially loaded into the instruction register 44, it is transferred in parallel on instruction bus 62 to the instruction decoder 46 under control of the decoder control input signal on line 84 from the state machine 50. In accordance with the instruction stored therein, the instruction decoder will set one of either the SCANMODE signal or the DIAGMODE signal in accordance with whether it is a scan test or a diagnostic test which is to be performed. The loading of the instruction register 44 and the instruction decoder 46 are controlled by the state machine 50 in accordance with IEEE Standard 1149.1-1990. In accordance with the instruction decoded by the instruction decoder 46, and as described further hereinafter, the parallel output on line 70 of the instruction decoder 46 controls the data multiplexor 52 to connect one of its inputs to the output line 74. Similarly the output on line 78 of the state machine 50 controls the instruction/data multiplexor to connect one of its inputs to the output on line 80.

The ID register 42 receives the DEVICEID signal in parallel on lines 12. The ID register 42 stores a chip identifier which can be scanned out of the ID register 42 via line 68 to the test data output signal TDO. The chip identifier identifes the integrated circuit 2.

In one mode of operation the instruction decoded by the instruction decoder 46 may be simply to output the identity of the device, in which case the multiplexor 52 is controlled to connect its input on line 68 to its output on line 74, and the instruction/data multiplexor 54 is controlled to connect its input on line 74 to its output on line 80. The identity of the device is then serially output as the signal TDO.

In another mode of operation it may be required to output the current instruction on the test data output signal TDO, in which event the serial output on line 76 is connected by the instruction/data multiplexor 54 to the line 80.

In one mode of test operation, it may be required that the TAP controller 4 of a particular integrated circuit 2 merely connect the test data input signal TDI to the test data output signal TDO. In this mode of operation the data multiplexor is controlled to connect the output of the bypass flip-flop on line 72 to the output on line 74, and the instruction/data multiplexor is controlled to connect the line 74 to the output line 80. Thus the test data input signal TDI is connected to the test data output signal TDO via the flip-flop 56.

The latch 56 is merely a flip-flop provided only to allow timing control of the test data output signal TDO so that such signal can be synchronised to the negative edge of the test clock signal TCK.

If the test mode to be carried out is a scan test mode, then the instruction decoder 46 sets the signal SCANMODE. The data multiplexor 52 is controlled by the instruction decoder 46 to connect the signal SCANOUT to the output line 74. The instruction/data multiplexor 54 is also controlled to connect the line 74 to the line 80 so as to output the signal SCANOUT as the test data output signal TDO. During such a scan test mode test data is scanned into the selected scan chain on the SCANIN signal which is connected directly to the test data input signal TDI. Scan testing, in particular boundary scan testing, is fully described in IEEE Standard 1149.1-1990. It will be appreciated that additional control signals, in accordance with the test to be performed, need to be supplied to the selected scan chain to achieve the required test operation.

In the described embodiment a diagnostic mode may also be entered, in which case the instruction decoder 46 sets the signal DIAGMODE on the output line 26. Furthermore, the data multiplexor 52 will be controlled to connect the signal DIAGSCANOUT on line 36 to the output on line 74, which in turn is connected to the line 80 through the instruction/data multiplexor 54 and to the test data output signal TDO via the flip-flop 56.

In diagnostic mode, the serial data flow between the test data input signal TDI and the test data output signal TDO may be considered to pass through a shift register of infinite length as opposed to the scan test mode, in which mode the serial data flow is through a shift register (shift register chain) of finite length. In the diagnostic mode, a sequence of bit patterns shifted into the test access port as the test data input signal TDI are never reflected in the sequence of bit patterns shifted out of the test access port as the test data output signal. The communication of diagnostic data may include memory access requests from host to target and target to host (reads and writes); status information of CPU registers; data read from host memory or target memory in response to a memory access request; status data for loading into CPU registers; and information about memory addresses being accessed by the target CPU. Thus the diagnostic mode may involve non-intrusive monitoring of data, or intrusive loading of data.

In the diagnostic mode the serial data shifted into the test access port is a uni-directional serial data stream which can be encoded in any desired means, for example, with start and stop bits to delineate data chunks. Likewise, data shifted out via the test access port is a uni-directional serial data stream which can be encoded in any desired means, for example with start and stop bits to delineate data chunks. Normally the data shifted in and the data shifted out will be encoded in the same way. The input and output uni-directional data streams may be used simultaneously to allow full-duplex, bidirectional, serial communications. The sequence of serial data bits could constitute a byte of information.

Figure 3:
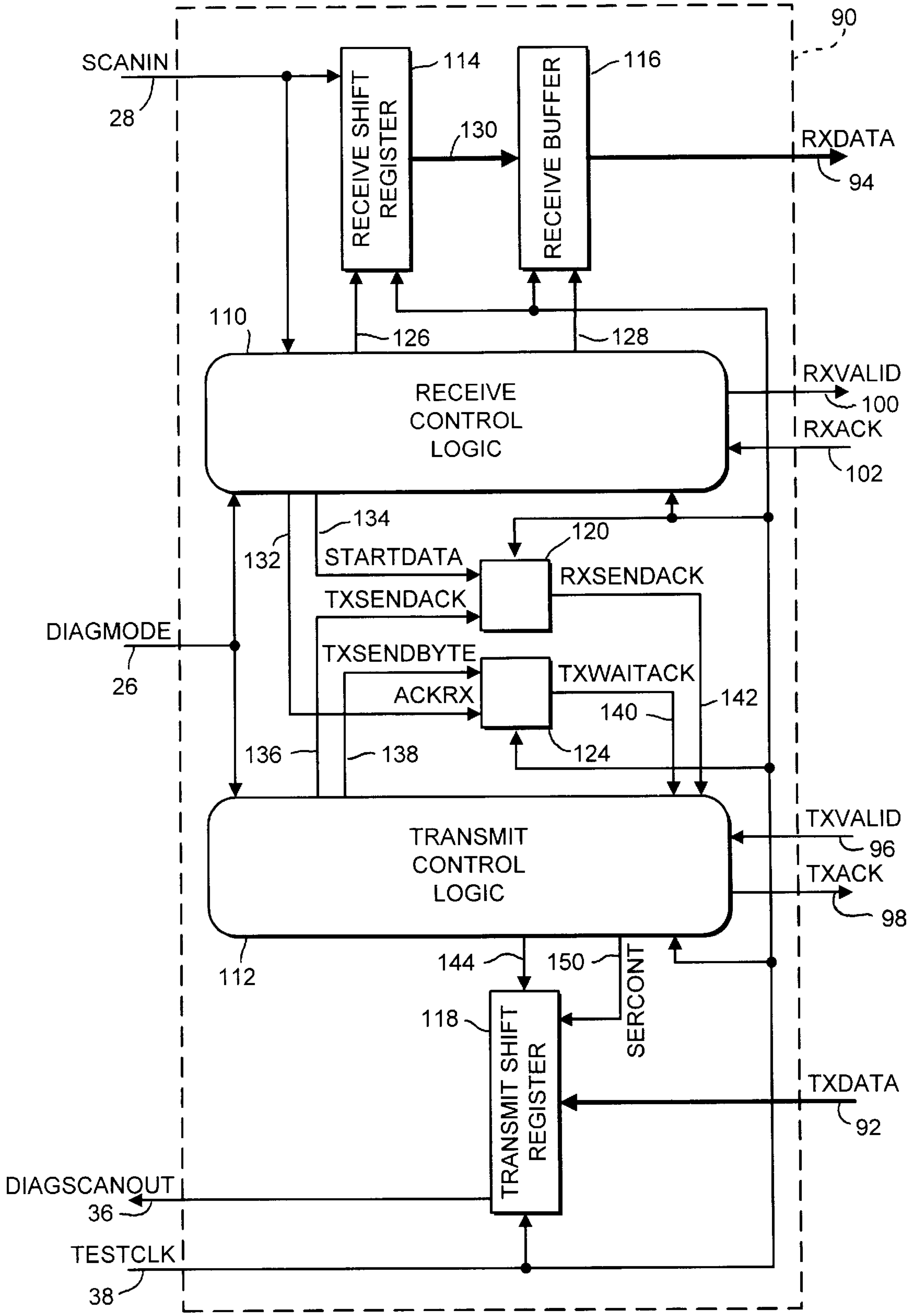
FIG. 3 illustrates a data adaptor according to the described embodiment for connection to the test access port controller of FIG. 2.

In the described embodiment, when provided with a diagnostic mode of operation in addition to a normal test mode, the integrated circuit 2 is preferably provided, as shown in FIG. 3, with a data adaptor 90 to interface between the TAP controller 4 and on-chip source/destination logic. The data adaptor 90 receives as inputs from the TAP controller 4 the scan data input signal SCANIN on line 28, the test clock signal TESTCLK on line 38 and the signal indicating selection of the diagnostic mode DIAGMODE on line 26. The data adaptor 90 outputs to the TAP controller 4 the signal DIAGSCANOUT on line 36. The data adaptor receives data from on-chip source/destination logic on a transmit data bus TXDATA on line 92, and outputs data to on-chip source/destination logic on a receive data bus RXDATA on line 94. The data adaptor 90 inputs a transmit valid signal TXVALID on line 96, and outputs a transmit acknowledge signal TXACK on line 98, both of which signals are control signals associated with the transmit data bus TXDATA. The data adaptor 90 outputs a receive valid signal RXVALID on line 100 and inputs a receive acknowledge signal RXACK on line 102, both of which signals are control signals associated with the receive data bus RXDATA.

The data adaptor 90 comprises a receive shift register 114, a receive buffer 116, receive control logic 110, a receive flow control status flip-flop 120, a transmit flow control status flip-flop 124, a transmit shift register 118, and transmit control logic 112. The receive shift register 114 receives the signal SCANIN on line 28 and a control signal from the receive control logic on line 126, and outputs data in parallel on bus 130 to form an input to the receive buffer 116. The receive buffer additionally receives a control signal from the receive control logic on line 128 and generates the receive data bus signal RXDATA on line 94. The receive control logic additionally generates the signal RXVALID on line 100, receives the signal RXACK on line 102, receives the signal DIAGMODE on line 26, and generates signals STARTDATA and ACKRX on lines 134 and 132 respectively. The receive flow control status flip-flop 120 receives the signal STARTDATA and a signal TXSENDACK on line 136, and outputs a signal RXSENDACK to the transmit control logic on line 142. The transmit flow control status flip-flop 124 receives the signal ACKRX and a signal TXSENDBYTE on line 138, and outputs a signal TXWAITACK to the transmit control logic on line 140. The transmit control logic 112 additionally receives the signal DIAGMODE on line 26 and the signal TXVALID on line 96, and outputs the signal TXACK on line 98, a control signal to the transmit shift register 118 on line 144, and a parallel signal SERCONT to the transmit shift register 118. The transmit shift register 118 additionally receives the parallel data bus TXDATA on lines 92, and outputs the signal DIAGSCANOUT on line 36.

The data adaptor may optionally be provided with an input from the on-chip system clock, although this connection is not shown in any of the figures. The system clock may be used for synchronous implementations where the data and control signals between the data adaptor and the on-chip destination/source logic must be synchronous with the clock of the on-chip destination/source logic. The data adaptor 90 performs synchronisation of serial data from the TAP controller clocked by the signal TESTCLK (derived from the signal TCK) to the clock environment of the internal functionality of the destination/source logic, and to the TAP controller clocked by the signal TESTCLK from the clock environment of the internal destination/source logic. The TAP controller 4 may optionally provide a scan enable signal to the data adaptor 90, which signal is also not shown in the figures. Such a scan enable signal indicates that the TAP controller has selected this scan path for data output onto the test data output signal TDO.

The data adaptor converts the uni-directional serial data from off-chip through the TAP controller 2 into a format more suited for use by the on-chip destination/source logic. Conversely the data adaptor must convert the data format supplied by the on-chip destination/source logic into unidirectional serial data. In the preferred embodiment, it is desired to provide data to the on-chip destination/source logic in the form of eight parallel bits, or a byte, of data. However, in the extreme the receive data bus RXDATA and the transmit data bus TXBUS could be only one bit, rather than a byte, wide. It is also envisaged that the receive and transmit data buses RXBUS and TXBUS could be multiple byte wide buses.

The data adaptor 90 must perform the function of "flow control" of both receive and transmit data. Serial data may only be passed through the TAP controller 4 (in either direction) when the receiving end has capacity available to receive that data to prevent data loss or corruption. The communication of the fact that the receiving end is ready to receive more data is achieved by transmitting such information in the reverse direction. This constitutes the flow control protocol. The data adaptor 90 according to the described embodiment provides for the unidirectional serial data to be converted into parallel format for communication with the on-chip destination/source logic. Thus a flow control protocol is also necessary between the data adaptor 90 and the on-chip destination/source logic.

This flow control must thus be performed across two boundaries: the boundary between the TAP controller 4 and the data adaptor 90; and the boundary between the data adaptor 90 and the on-chip destination/source logic to which the data adaptor 90 interfaces.

Figure 4:
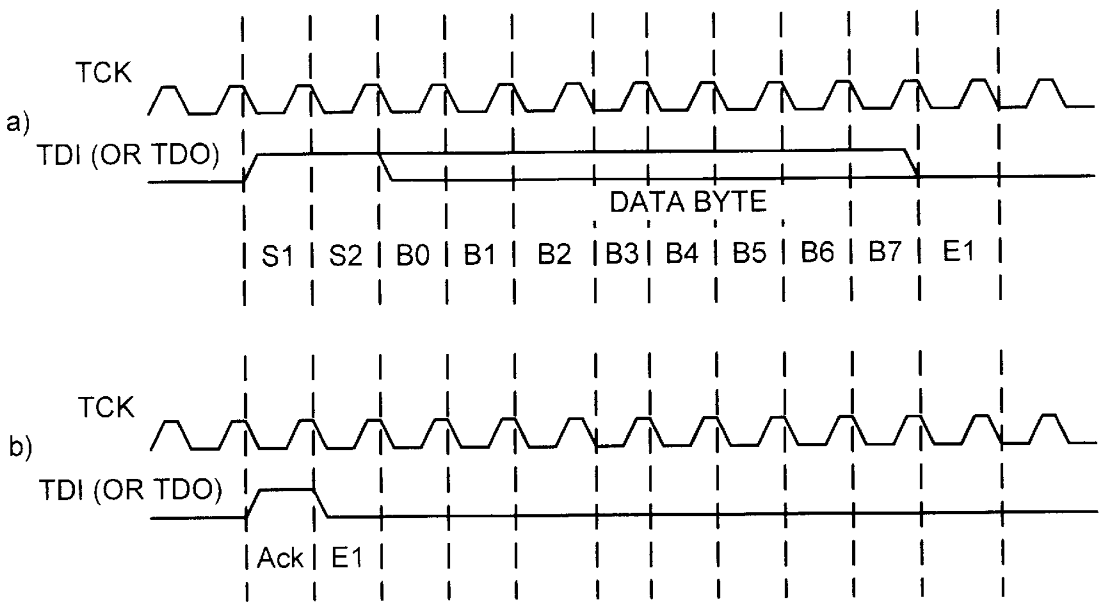
FIG. 4 illustrates the data format for data communicated off-chip via the test access port controller of FIG. 2 in a diagnostic mode.

To provide flow control between the TAP controller 4 and the data adaptor 90 the unidirectional data on the test data input signal TDI line and the test data output signal line are encoded with start and stop bits as shown in FIG. 4 (*a*). The bit flow control protocol is return to zero (RTZ) signalling with two start bits S1 and S2, and a stop bit E1. In between the start bits and the stop bit is included a byte of data. Serial data in this format is passed from the test data input TDI of the TAP controller to the SCANIN signal on line 28 and input to the data adaptor 90. The receive control logic 110 of the data adaptor receives the serial data signal SCANIN. When the receive control signal recognises two successive serial bits as being the start bits S1 and S2, the receive shift register 114 is controlled on the line 126 to serially load the next eight successive bits, which form a data byte, therein.

In response to the two consecutive start bits S1 and S2, the receive control logic 110 also sets the signal STARTDATA on line 134, which sets the receive flow control status flip-flop 120. When set, the receive flow control status flip-flop 120 in turn sets the signal RXSENDACK on line 142, which signal causes the transmit control logic 112 to send an acknowledgement signal on the test data output signal TDO in the form shown in FIG. 4 (*b*), which signal comprises only a start acknowledge bit ACK and a stop bit E1. These bits are loaded directly into the transmit shift register in parallel as the signal SERCONT on line 150 under the control of the signal on line 144, and output from the transmit shift register in serial fashion in the form of FIG. 4(*b*), as the signal DIAGSCANOUT. Once the acknowledgement signal has been sent, the transmit control logic 112 sets the signal TXSENDACK on line 136 to reset the receive flow control status flip-flop and thereby reset the signal RXSENDACK.

The signal SERCONT, in accordance with the flow control protocol used in this embodiment, is a 3 bit signal which enables the start bits S1, S2 and the stop bit E1 to be loaded directly into the transmit shift register 118. When a byte of data is presented by the on-chip destination logic, to be output through the TAP controller 4, is present on the transmit data bus TXDATA it is loaded in parallel under the control of the transmit control logic 112 into the transmit shift register 118, and the transmit control logic 112 directly loads the start bits S1, S2 and the stop bit E1 forming signal SERCONT into the appropriate bit positions in the transmit shift register prior to serially shifting a signal in the format shown in FIG. 4 (*a*). When sending an acknowledgement signal the transmit control logic 118 directly loads a single start bit and a stop bit into the transmit shift register, and then serially shifts them out.

When the receive control logic 110 receives the stop bit E1 on the signal SCANIN, the data byte has been loaded into the receive shift register 114, and under the control of the receive control logic 110 the data byte is transferred on bus 120 from the receive shift register 114 to the receive buffer 116. When a data byte has been loaded into the receive buffer 116 it is output on the bus RXDATA under control of the receive logic 110, which also sets the signal RXVALID on line 100. The destination/source logic on-chip, responsive to the signal RXVALID, accepts the data byte on the RXBUS and indicates this acceptance by setting the signal RXACK on line 102. In response to the signal RXACK the receive control logic 110 resets the signal RXVALID, and if there is a further data byte in the receive shift register 114 transfers this to the receive buffer 116 before again setting the signal RXVALID.

The receive buffer 116 is provided in the preferred embodiment. This allows acknowledge tokens, which overlap the reception of data, to be transmitted as soon as the two start bits have been received, and this also supports efficient data transfer rates by allowing successive bytes to be transferred without any gap between each byte. Data buffering may also be provided on the transmit side.

The destination/source logic on-chip transfers data bytes in parallel to the data adaptor 90 on the TXDATA bus 92. When the destination/source logic on-chip has a byte of data to be transmitted, the signal TXVALID on line 96 is set. In response to the signal TXVALID being set, the transmit control logic controls the transmit shift register 118 via line 144 to load the data byte on the TXDATA bus in parallel. In addition, using lines 150 the transmit control logic loads the appropriate start bits S1 and S2 and the stop bit E1 into the transmit shift register 118. Then, again under the control of the signal 144, the data byte including two start bits and a stop bit is serially shifted out of the transmit shift register as signal DIAGSCANOUT, which is connected through the TAP controller to the signal TDO. When the data byte on the bus TXDATA is loaded into the shift register, the transmit control logic sets the signal TXACK on line 98 to acknowledge receipt of the data byte to the destination logic on-chip. The destination logic on-chip can then transmit a further byte of data. Data buffering may be provided in association with the transmit shift register if desired.

When the transmit shift register 118 is controlled by the transmit control logic 112 to output serial data in the form shown in FIG. 4(*a*), the transmit control logic 112 also sets the signal TXSENDBYTE on line 138, which sets the transmit flow control status flip-flop 124. In response to this signal, the transmit flow control status flip-flop 124 sets the signal TXWAITACK on line 140. Whilst the TXWAITACK signal is set, the transmit control logic is waiting for an acknowledgement from the destination/source logic off-chip that the data byte set has been received. If the destination/ source logic off-chip successfully receives the transmitted data byte than it sends on the test data input signal TDI an acknowledgement signal of the type shown in FIG. 4(*b*). Upon receipt of such an acknowledgement signal as the SCANIN signal on line 28, the receive control logic 110 will set the signal ACKRX on line 132, causing the transmit flow control status flip-flop 124, and consequently the signal TXWAITACK, to be reset. The transmit control logic 112 is then prepared to receive and transmit the next parallel data byte from the source/destination logic on-chip.

FIG. 5 illustrates in schematic form how the data adaptor 90 may be used to establish a connection between a host memory and a target memory. The integrated circuit 2 comprises the TAP controller 4 and the data adaptor 90 which communicate between each other, off-chip, and with circuitry on-chip using signals as described hereinabove. The same reference numerals are used in FIG. 5 to denote signals which correspond to those already described. As can be seen in FIG. 5 the integrated circuit 2 also comprises a memory bus adaptor 160, a target CPU 162, and an on-chip memory 164. The integrated circuit 2 is provided with a memory bus 166 which interfaces with the target CPU 162 and the on-chip memory 164. The memory bus 166 is also connected to off-chip memory 174. Off-chip the test access port signals TCK,TMS,TDI,TDO and TRST* are connected to a TAP controller initialliser 176, which itself receives a serial data input signal SERIN on line 178 from a further data adaptor 180 and outputs a serial data output signal SEROUT on line 179 to the further data adaptor 180. The further data adaptor 180 outputs signals EXTRXDATA, EXTRXVALID, and EXTTXACK on lines 190,188 and 186 respectively to a further memory bus adaptor 194, and receives signals EXTTXDATA, EXTTXVALID, and EXTRXACK on lines 184,182 and 192 respectively from the further memory bus adaptor 194. The memory bus adaptor 194 is connected to an external memory bus 198. A host CPU 200 is connected to the external memory bus 198 and a further off-chip memory 202 is connected to the external memory bus 198.

The TAP controller initialiser 176 configures the TAP controller 4 for operation either in the test mode or the diagnostic mode. The memory bus adaptors 160 and 194 adapt the parallel data on the bus RXDATA to a message format more suitable for communication with the on-chip destination/source logic. The memory bus adaptors are therefore message converters, and may be message converters of the type described herein. The memory bus adaptors must also convert the message format of the on-chip destination/source logic into parallel data bytes for transmission of the bus TXDATA.

The structure of FIG. 5 can be used to implement various diagnostic procedures. The serial links on and off chip can allow the communication of various different types of diagnostic data between the integrated circuit 2 and the host CPU 200.

The host CPU can access the on-chip memory 164 or the off-chip memory 174 using the on-chip bus system 166 but without involving the target CPU 162. To do this, a memory access request made by the host CPU can be transmitted via the interfacing circuitry comprising the off-chip memory bus adaptor 194, data adaptor 180 and TAP controller initialiser 176 and the on-chip TAP controller 4, data adaptor 90 and memory bus adaptor 160, undergoing the various conversions discussed herein. Similarly, data read from the on-chip memory 164 or off-chip memory 174 can be returned via the on-chip bus system 166 and the interface circuitry to the host CPU. Conversely, the target CPU may access the off-chip memory 202 associated with the host CPU. Data read from the off-chip memory 202 associated with the host CPU 200 can likewise be returned via the interface circuitry.

In addition, the target CPU can be monitored for diagnostic purposes. For example, its accesses to its own memory can be monitored by on-chip circuitry and information about the memory addresses which have been accessed can be transmitted to the host CPU using the interface circuitry. Moreover, the target CPU contains or has access to configuration registers which represent its status. Information about the content of these registers can be transmitted off-chip to the host CPU using the interface circuitry. Conversely, particular status information can be loaded into these registers to affect that state of the target CPU under the instruction of the host CPU.

Thus, the interface circuitry discussed herein allows the communication of diagnostic data including memory access requests from host to target and target to host (reads and writes); status information of CPU registers; data read from host memory or target memory in response to a memory access request; status data for loading into CPU registers; and information about memory addresses being accessed by the target CPU.

Thus, the interface circuitry allows the following diagnostic features to be provided in the circuit:

- the facility to implement real time diagnostic procedures, that is while the target CPU is operating in real time and without intruding on its operation while the diagnostic procedures are taking place. In particular, monitoring of the memory bus and accesses to the target memory can be undertaken by the host CPU without involving the target CPU;
- access to target memory and configuration registers from host;
- access to host memory from target;
- control of target CPU and sub-systems, including the facility to effect booting operations of the CPU from the host processor.

In the described embodiment, the unidirectional serial data stream shifted in and out of the test access port in the diagnostic mode of operation on the test data input signal TDI and the test data output signal TDO respectively, is information in the form of messages. Such messages may be initiated by the host CPU or by the target CPU. In a debugging environment, the host CPU can perform intrusive or non-intrusive diagnostics of the on-chip destination/ source logic. Alternatively, in the diagnostic mode, such messages may be initiated by the target CPU.

The memory bus adaptor 160 of FIG. 5 converts incoming messages to the chip into control information, address, and data for use by the on-chip destination/source logic. In the described embodiment, each message is a packet consisting of a plurality of bytes. As described hereinabove the data adaptor 90 converts incoming serial data into parallel bytes, and converts outgoing parallel bytes into serial data. The memory bus adaptor 160 decodes the incoming messages and provides control, address and data information to the on-chip destination/source logic accordingly. Similarly, the memory bus adaptor 160 encodes control, address and data information from the on-chip destination/source logic into messages which are transmitted in parallel to the data adaptor.

Figure 6:
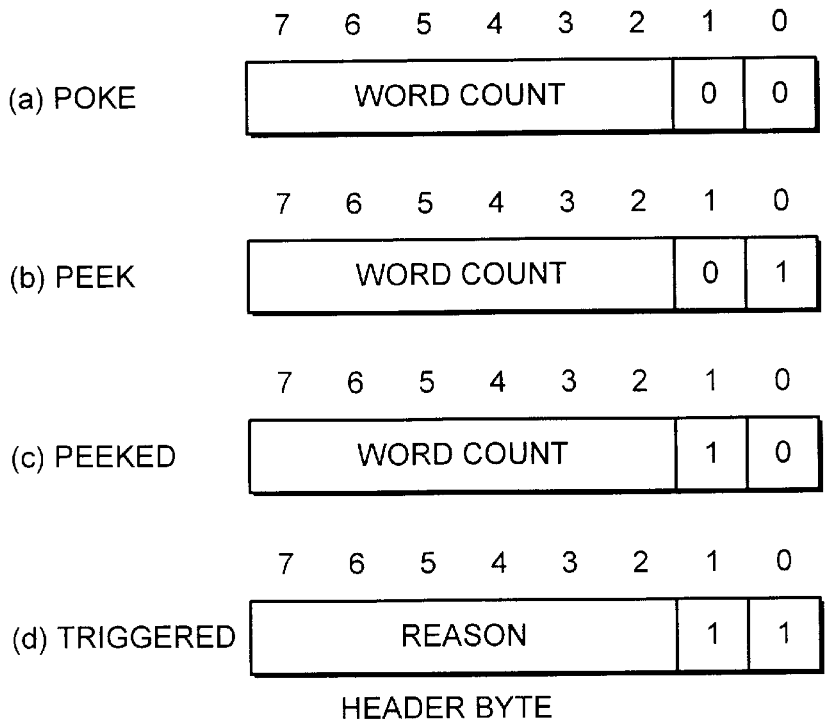
FIG. 6 illustrates the format of header bytes of messages according to the described embodiment.

In the described embodiment, there are two types of messages that may be initiated, and two types of messages which may be generated as responses. The two types of messages which may be initiated are a memory write request for writing specified data to a specified memory location, termed a "poke" and a memory read request for reading data from a specified memory location, termed a "peek". The two types of messages which may be generated as responses are a "peeked" message responding to a memory read request to return the read data and a "triggered" message, to be described later. The first byte of each message will be a header byte, the structure of which for each of the four messages is illustrated in FIG. 6. The header byte constitutes a packet identifier to identify the nature of the packet.

Figure 7:
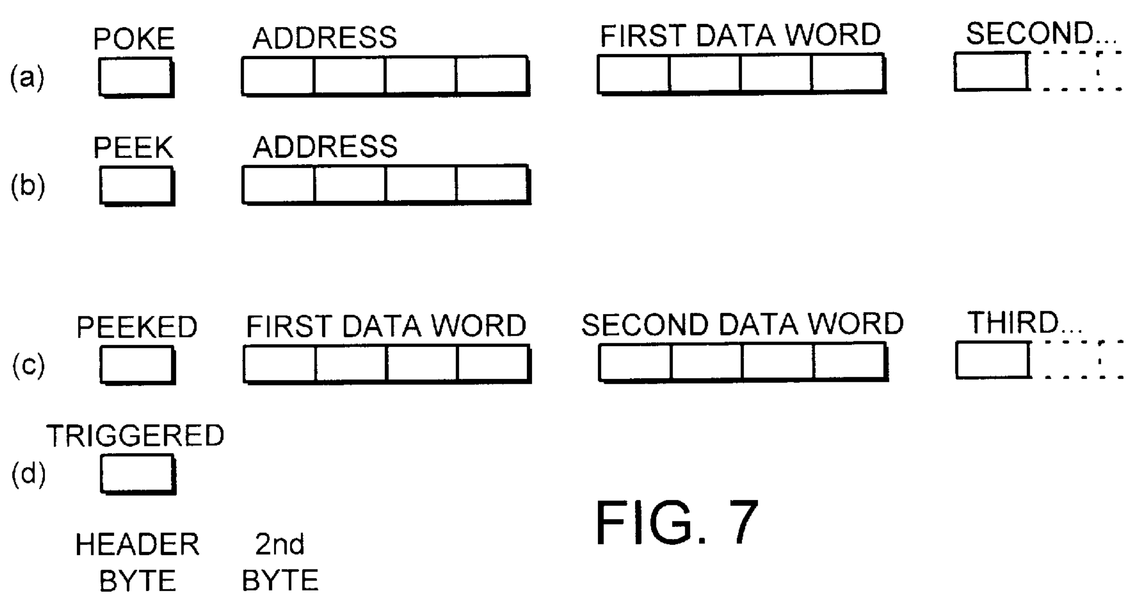
FIG. 7 illustrates the format of messages according to the described embodiment.

The first two bits of a header byte constitute a type identifier to identify the type of message, i.e. whether the message is a poke, a peek, a peeked, or a triggered message. The following six bits of the header byte act as a length indicator to identify the number of words following the header byte and associated with that message, thus indicating the length of the packet. Alternatively, as discussed in detail hereinafter, these six bits may act as a reason indicator. FIG. 7 illustrates the structure of each of four types of message according to the described embodiment. FIG. 7*a* shows a poke message as comprising a poke header byte 00+WORDCOUNT, followed by an address word, and followed by at least one data word. FIG. 7*b* shows a peek message as comprising a peek header byte 01+WORDCOUNT followed by an address word. FIG. 7*c* shows a peeked message as comprising a peeked header byte 10+WORDCOUNT followed by at least one data word. FIG. 7*d* shows a triggered message as comprising a triggered header byte only, 11+REASON. The operation of each of the four types of messages will be described in detail hereafter.

Figure 8:
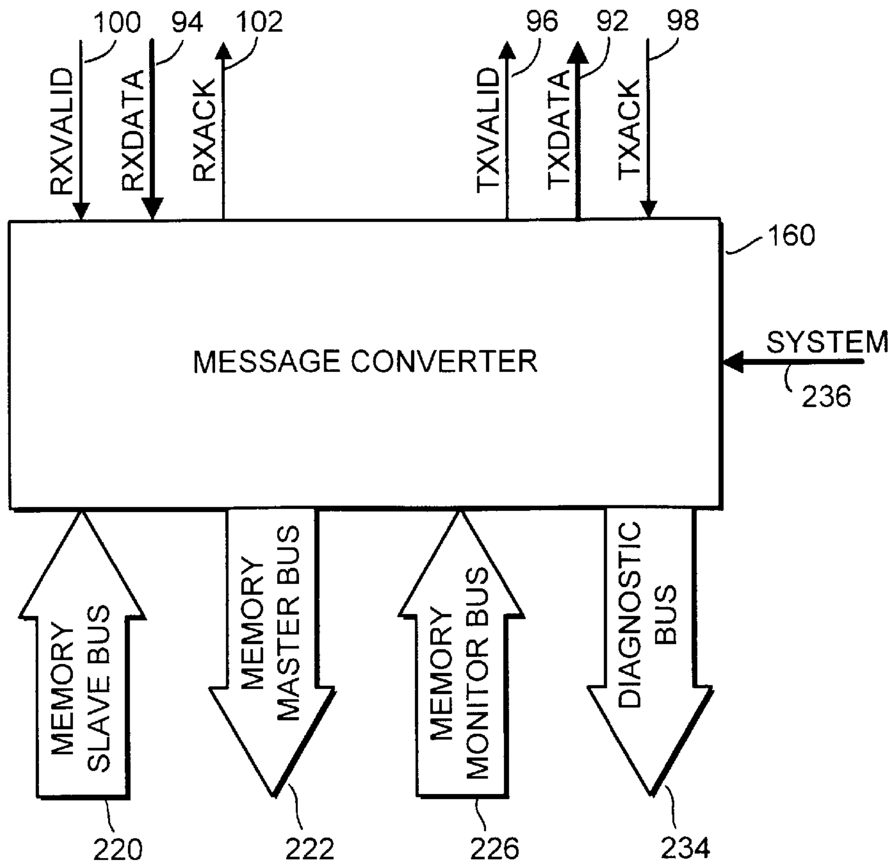
FIG. 8 illustrates schematically the message converter of the described embodiment.

As mentioned above, the memory bus adaptor 160 acts as a message converter and is referred to as such hereinafter. FIG. 8 illustrates a block diagram of a message converter 160 according to the described embodiment. The message converter 160 receives bytes of information on the receive data bus RXDATA on lines 94 from the data adaptor 90, and transmits bytes of information on the transmit data bus TXDATA on lines 92 to the data adaptor 90, as described in detail hereinabove. Furthermore, as described hereinabove, the message converter receives the signals RXVALID and TXACK on lines 100 and 98 respectively from the data adaptor, and generates signals RXACK and TXVALID on lines 102 and 96 respectively to the data adaptor. The message converter 160 additionally interfaces with the on-chip destination/source logic via three memory bus ports: a memory slave bus 220, a memory master bus 222, and a memory monitor bus 226. The message converter 160 further interfaces with the on-chip destinational source logic via a diagnostic bus 234. The message converter 160 further receives system signals SYSTEM on lines 236.

Figure 9:
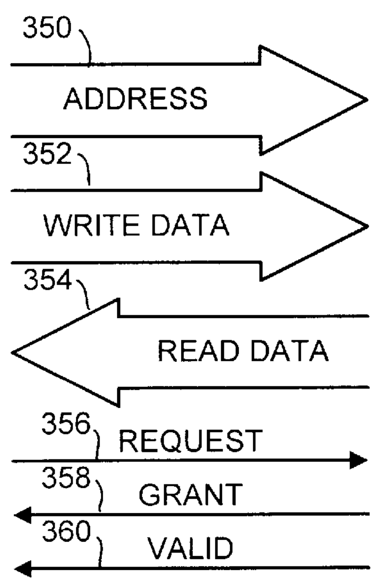
FIG. 9 illustrates the format of buses connected to the message converter in the described embodiment.

The memory slave bus 220, the memory master bus 222, the memory monitor bus 226, and the diagnostic bus 234 are each illustrated in FIG. 8 as unidirectional buses. However, each of these buses will contain signals the direction of which is opposite to that shown by the arrows of FIG. 8. The convention used in the drawing of FIG. 8 is that the direction of the arrow of the bus reflects the direction in which a request is being made. FIG. 9 shows more particularly the signals contained in each bus.

Referring to FIG. 9, each bus contains a plurality of ADDRESS signals 350, a plurality of WRITE DATA signals 352, a plurality of READ DATA signals 354, a REQUEST signal 356, a GRANT signal 358, and a VALID signal 360. Each of the buses has other control signals associated therewith which are not shown, e.g. read and write control signals. As can be seen from FIG. 9, the ADDRESS signals 350, the WRITE DATA signals 352, and the REQUEST signal 356 are all communicated in one direction, with the READ DATA signals 354, the GRANT signal 358 and the VALID signal 360 being communicated in the opposite direction. However, it should be noted that in the memory monitor bus 226, the READ DATA signals 354 and the GRANT signal 358 are also communicated in the same direction as the ADDRESS signals 350, the WRITE DATA signals 352 and the REQUEST signal 356. The VALID signal 360 is not connected in the memory monitor bus 226.

The memory master bus 222 is driven by the off-chip host CPU to make memory access requests to the target CPU's memory area, and can also be driven by diagnostic facilities. The memory slave bus 220 is driven by the target CPU to make memory access requests to the off-chip memory or to the diagnostic facilities. The memory monitor bus 226 is a fixed path bus which may be connected to the same on-chip signals as the memory slave bus 220 and which is used by diagnostic facilities to see (non-intrusively) what the target CPU is using the slave bus for. The diagnostic bus 234 is a register addressing bus rather than a memory bus, which enables reading and writing from and to on-chip diagnostic facilities to be carried out, as well as communicating triggered events generated by the diagnostic facilities. The diagnostic bus is also used to initiate memory accesses (either to local on/off-chip memory via the memory master bus or to remote host memory via the data adaptor) from diagnostic facilities.

Status signals are supplied from the target CPU to the message converter via the diagnostic facilities. These may include target CPU progress information, such as the instruction pointer with control signals indicating when the instruction pointer is valid. The host CPU may monitor the instruction pointer to determine what the target CPU is doing. The status signals may also include other target CPU status signals including miscellaneous individual control signals which provide additional information about the operating status of the CPU. The status is accessed by a "register" read on the diagnostic bus. The instruction pointer is also accessed by a "register" read, but from a different register address.

Other information associated with the status of the on-chip destination/source logic may be included as the status signal, such as information associated with the on-chip registers, but such information would typically only be derived from registers containing some abstraction of the on-chip functionality for diagnostic purposes. The function signals may be connected to any non-intrusive on-chip diagnostic facilities, for instance any registers which facilitate the abstraction of diagnostic information and control.

The memory master bus is connected to the on-chip address bus, write data bus, and read data bus and associated control signals. The memory master bus is used to allow the host CPU and diagnostic facilities access to the range of addresses within the target memory space, including on-chip memory 164, off-chip memory 174, and any other resource accessible via the memory bus such as configuration registers.

Rather than have separate bus ports to provide the various connections with the on-chip destination/source logic, it would be feasible to merge together so me buses, using appropriate control signals to distinguish between them. For example the memory bus write data and read data may be merged onto a common memory data bus. Memory addresses may be merged with memory data. The memory slave bus may be merged with the memory master bus. Such alternatives represent implementation trade-offs between performance, area and other factors.

The system signals on line 236 provide connection with system services. Such system services may be clocking, power, reset, test for example.

The message converter receives successive bytes of information, which have been converted into a byte serial format from a bit serial format by the data adaptor, and reads the header byte to determine the message conveyed therein. The message converter 160 thus interprets the incoming messages and performs the necessary action accordingly. Such necessary action includes selecting the information to be returned to the host, or initiating a memory access via an appropriate one of the buses connected to the message converter to read or write data. The message converter 160 also compiles parallel data received from the on-chip buses into messages for transmission off-chip according to the message protocol. This involves allocating a header byte to the parallel data and address bytes to define the nature of the message depending on the incoming data, address and control signals. The operation of the message converter 160 of FIG. 8, and the message protocol of FIGS. 6 and 7, will now be described in detail with reference to FIG. 10.

Figure 10:
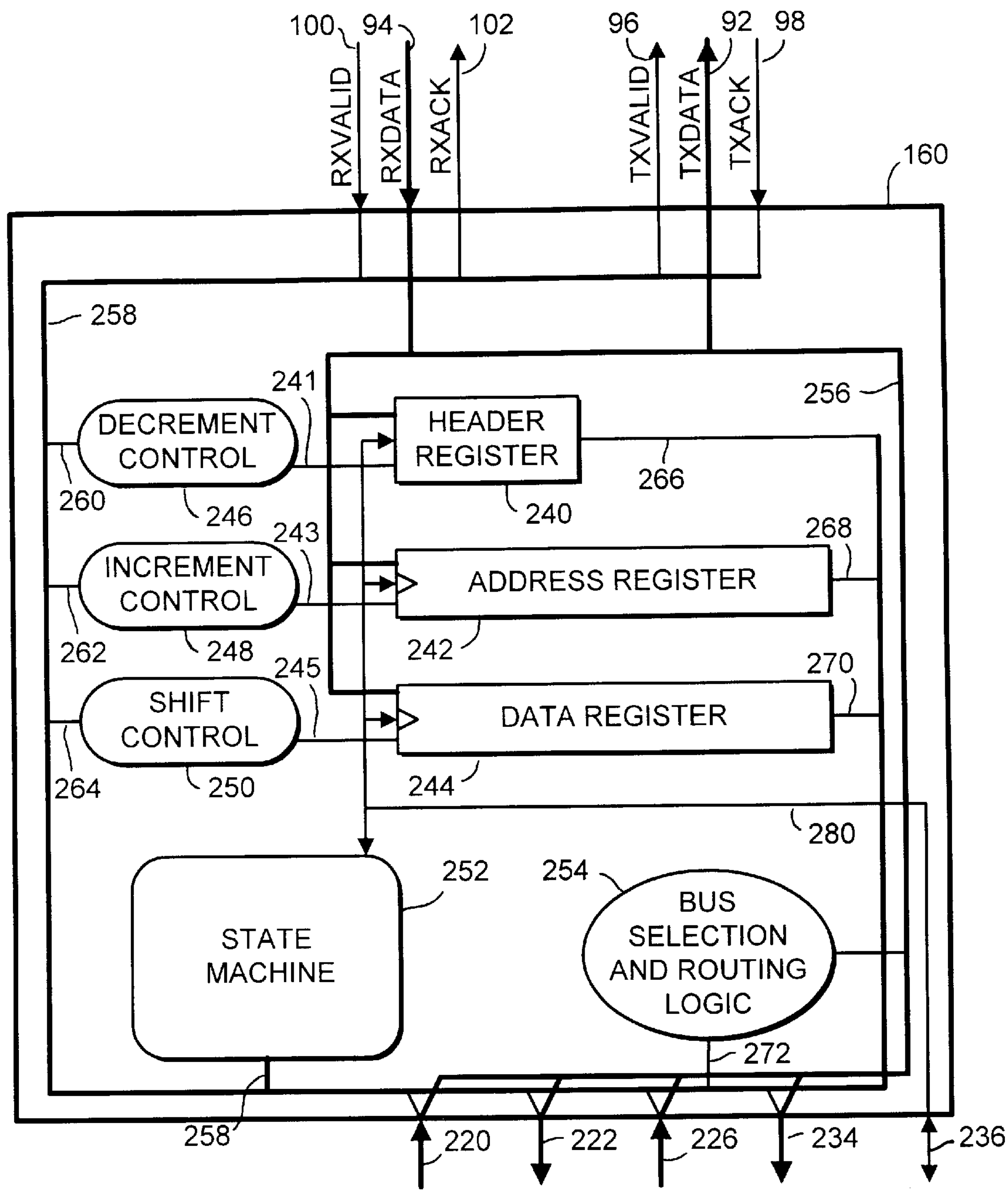
FIG. 10 illustrates an implementation of the message converter of the described embodiment.

FIG. 10 illustrates the message converter 160 according to the described embodiment. The message converter comprises a header register 240, an address register 242, a data register 244, a decrement control 246, an increment control 248, a shift control 250, a state machine 252, and bus selection and routing logic 254. The message converter 160 is provided with an internal control bus 258 for communicating all control signals and an internal information bus 256. The control bus 258 is connected to the state machine 252, and communicates the flow control signals RXVALID, RXACK, TXVALID, and TXACK to and from the state machine 252. The control bus 258 further communicates a decrement control signal on line 260 to the decrement control 246, an increment control signal on line 262 to the increment control 248, a shift control signal on line 264 to the shift control 250, a header control signal on line 266 to the header register 240, an address control signal on line 268 to the address register 242, a data control signal on line 270 to the data register 244, and a selection and routing control signal on line 272 to the bus selection and routing logic 254. The header register 240 receives a control signal on line 241 from the decrement control 246, the address register 242 receives a control signal on line 243 from the increment control 248, and the data register 244 receives a control signal on line 245 from the shift control 250. The information bus 256 carries the received data bytes RXDATA to the header register 240, the address register 242, the data register 244, and the bus selection and routing logic 254. Additionally the information bus 256 carries the outputs from the bus selection and routing logic 254, data register 244, address register 242, and header register 240 to the transmit data signal TXDATA. The bus selection and routing logic 254 routes the information on the information bus 256, which in the described embodiment is a byte wide, to and from one of the memory slave bus 220, the memory master bus 222, the memory monitor bus 226, and the diagnostic bus 234.

In the embodiment of FIG. 10 the system signals 236 merely provide the clock signal on line 280 which is used to clock the header register 240, the address register 242, the data register 244, and the state machine 252. Operation of the message converter 160 will now be described for the various types of message possible.

When the host CPU initiates a poke, a serial message in the form shown in FIG. 7*a* is received at the test access port of the integrated circuit 2, and subsequently output in the form of parallel bytes of information by the data adaptor 90 on the received data bus RXDATA. On outputting each parallel byte of information on the received data bus RXDATA, the data adaptor 90 sets the signal RXVALID on line 100. In response to the signal RXVALID on line 100, the state machine 252 of the message converter 160 loads the information byte on the received data bus RXDATA into the message converter 160 and sets the signal RXACK on line 102 to acknowledge receipt of the information byte. In response to the data adaptor 90 setting the signal RXVALID to indicate a first byte of information of a message, the state machine 252 controls the header register 240 via the line 266 to load the byte of information on the received data bus RXDATA into the header register 240 via the information bus 256. The state machine 252 then looks at the two least significant bits of the byte loaded in the header register 240 to determine which type of message is incoming. In this instance, the state machine 252 identifies the two least significant bits of the byte received as being 00, identifying the incoming message as corresponding to a poke message. A poke message initiated by the host CPU contains data which the host CPU wishes to insert in a specified address within the target CPU memory area. The word count associated with the header byte stored in the header register 240 is the count of the number of data words in the message. The state machine 252 controls the address register 242 via lines 268 to load the next four bytes received on the received data bus RXDATA into the address register 242 via the information bus 256, which four bytes form the address word. Once the address word has been loaded into the address register 242, the next four bytes received on the received data bus RXDATA, which form the first data word, are loaded into the data register 244 under the control of the state machine 252 via control line 270. The state machine 252 then controls the bus selection and routing logic 254 via line 272 to output the contents of the address register 242 and the data register 244 onto the memory master bus 222.

On outputting the contents of the address and data registers onto the memory master bus 222, the state machine 252 sets the write control signal associated with that bus and the request signal on line 356 associated with the memory master bus. When a memory arbiter associated with the memory space of the target CPU being accessed determines that the requested memory access can proceed, it asserts the grant signal on line 358 associated with the memory master bus. The message converter 160 may have a low priority, in which case it is granted only if higher priority requesters (for example the CPU) are not requesting and have completed previous accesses. A request, and grant set of signals are required for each data word transferred.

After the memory access, if the word count contained in the header register 240 is not one (one indicating, in this embodiment, a word count of zero), then the address register 242 is incremented by the increment control 248 via control line 243, and a further word of information loaded into the data register 244. Again, after loading of the data word into the register 244 the address stored in the address register 242 and the data stored in the data register 244 are output on the memory master bus with the write control signal and the request signal being set, and the data word contained in the data register 244 is written to the address contained in the address register 242 the acknowledgement of which is confirmed by the memory arbiter setting the grant signal on the memory master bus. Such a sequence of incrementing the address register 242 and loading in four bytes of information into the data register 244 is continued until the word count contained in the header register 240 is equal to one, i.e. no data words remain.

When the host CPU initiates a peek, a serial message in the form shown in FIG. 7*b* is received at the test access port of the integrated circuit 2 and subsequently output in the form of parallel bytes of information by the data adaptor 90 on the received data bus RXDATA. In response to the data adaptor 90 setting the signal RXVALID to indicate a first byte of information, the state machine 252 controls the header register 240 to load the byte of information therein. The state machine 252 then looks at the two least significant bits of the byte loaded therein to determine what message is incoming, and in this instance identifies the two least significant bits of the byte received as being 01, identifying the incoming message as corresponding to a peek message. A peek message initiated by the host CPU contains an address within the target CPU memory area, the contents of which the host CPU wishes to look at.

When the state machine 252 identifies a peek message loaded into the header register 240 by identifying the first two bits of the header byte contained therein as being 01, then the state machine 252 changes the first two bits of the header byte to correspond to the appropriate bits for a peeked header, i.e. to 01, and transmits such a changed header byte on the transmit data bus back to the host CPU, including the word count stored in the header register intact, to form the header byte of the returned peeked message in the form shown in FIG. 7*c*. In other words the peek header byte is returned as a peeked header byte, with the word count intact and the two least significant bits changed from 01 to 10. The next four bytes of information received on the received data bus RXDATA are loaded into the address register 242 and form the address word. The state machine 252 then controls the selection and routing logic 254 via line 272 to output the address word contained in the address register 242 onto the memory master bus 222 in conjunction setting the read control signal associated with that bus and with the request signal associated with the memory master bus being set.

In response to the request signal being set, when the memory arbiter associated with the memory space of the target CPU being accessed determines that the requested access can proceed, the arbiter sets the grant signal associated with the memory master bus. When the actual memory location associated with the address output on the memory master bus has been accessed and the data stored therein has been output on the read data bus of the memory master bus, then the arbiter sets the signal VALID associated with the memory master bus to indicate that the data is now ready to be sent back to the host CPU. In response to the VALID signal being set the state machine 252 controls the bus selection and routing control logic via line 272 to load the data on the read data bus of the memory master bus into the data register 244. The data word loaded into the data register 244 is then shifted out onto the transmit data bus TXDATA via the information bus 256 a byte at a time and transmitted back to the host CPU. A request, grant and valid set of signals are required fro each data word transferred.

After the data word loaded into the data register 244 has been shifted back to the host CPU, the state machine 252 controls the decrement control 246 via line 260 to reduce the word count contained in the header register 240 by one via the control line 241. If the word count is not one then the increment control 248 is controlled by the state machine 252 via line 262 to increase the address contained in the address register 242 via the control line 243, and such address is again output by the bus selection and routing logic 254 onto the memory master bus 222 in conjunction with the request signal and the read control signal being set. In this way, the next successive memory location in the target CPU memory area is read and the contents thereof written into the data register 244 of the message converter 160. Again, such data word is shifted out byte by byte on the transmit data bus TXDATA to the host CPU, and the word count in the header register is again decremented by one. Such a cycle is repeated until the word count contained in the header register 240 is equal to one, i.e. no data words remain.

The target CPU itself may initiate a poke or a peek message, to either write data or read data from the memory space of the host CPU 200. The target CPU's initiation of a poke or a peek will be recognised by the state machine 252 monitoring the memory slave bus 220 of the target CPU area and its associated control signals and identifying that an address output on the address bus by the target CPU is within the address range of the host CPU and not the target CPU, in conjunction with either a read or a write control signal. In contrast to the pokes and peeks initiated by the target CPU as discussed hereinabove which can perform multi-word peeks and pokes, the target CPU can only perform single word peeks and pokes.

When the target CPU initiates a poke, this is recognised by the state machine 252 identifying a write signal associated with the write data bus of the memory slave bus, and a request signal associated with the memory slave bus being set. In addition, the state machine 252 recognises that the address associated with the write data being requested by the memory slave bus is outside of the memory range of the target CPU area. In response to such conditions, the state machine 252 loads a pre-stored poke header byte as shown in FIG. 6(*a*) directly into the header register 240 via control lines 266. Such a poke header byte has a word count indicating one data word. The address word on the address data bus of the memory slave bus is then loaded under the control of the state machine 252 into the address register 242 through the bus selection and routing logic 254, and the write data on the write data bus of the memory slave bus is similarly loaded into the data register 244 of the data adaptor 160. Under the control of the state machine 252, the poke byte in the header register 240 is then output on the transmit data bus TXDATA to the host CPU, followed successively by the four address bytes contained in the address register 242, and the four data bytes contained in the data register 244.

Similarly in response to the state machine 252 identifying on the memory slave bus a read signal in conjunction with a request signal and an address on the address bus of the memory slave bus which is outside of the range of addresses of the target CPU area, the state machine 252 will load into the header register 240 the header byte shown in FIG. 6(*b*) corresponding to a peek header byte. In this case, the header byte will contain a word count of one, i.e. indicating no data words. Similarly, as described hereinabove, the state machine 252 will also control the data adaptor 160 to load the address on the address bus of the memory slave bus into the address register 242. The header byte contained in the header register 240 is then output on the transmit data bus TXDATA, followed by the four successive bytes stored in the address register 242.

At this stage the message converter 160 has finished with the target initiated peek message, but the target CPU has not received the VALID signal on the memory slave bus 220, and as a result the target CPU is "stuck" (i.e. locked up or waiting continuously) and cannot do anything else (not even a stall or other interrupt). However, the message converter 160 is not stuck. It is in a position to proceed with any of its other activities (although it will not receive a target initiated peek or poke request because the CPU is stuck).

Thus, when the message converter has transmitted the memory access message to the off-chip host processor, it is free to deal with subsequent messages or requests.

In response to a poke or a peek being initiated by the target CPU, the host CPU may respond with a peeked message. The receipt of a peeked message from the host CPU is identified by the state machine 252 recognising a header byte in the header register which corresponds to the structure of FIG. 6 (*c*). The next four bytes of information from the received data bus RXDATA will be shifted into the data register 244, and the data word loaded therein transferred by the bus selection and routing control logic 254 to the data bus of the memory slave bus 220 of the target CPU area under the control of the state machine 252 in conjunction with the VALID signal associated with the memory slave bus being set, thus indicating to the memory arbiter associated with the memory space of the target CPU that the data requested by its peek request is now available. As the target CPU can only initiate single word peeks, the peeked message from the host CPU will contain only a single data word. Once the target CPU has received the VALID signal, it is no longer "stuck".

The memory slave bus 220 is used by the target CPU to access the on-chip diagnostic functions which can be accessed by the host CPU through the message converter 160. This is the same bus as used for target initiated peeks/pokes, and the address range determines whether this is an access to the on-chip diagnostic functions or not. In response to any actions being initiated on the memory slave bus 220 by the target CPU, the state machine 252 controls the bus selection and routing logic 254 via the line 272 to transfer any information or control signals on the memory slave bus 220 to the diagnostic bus 234.

Figure 11:
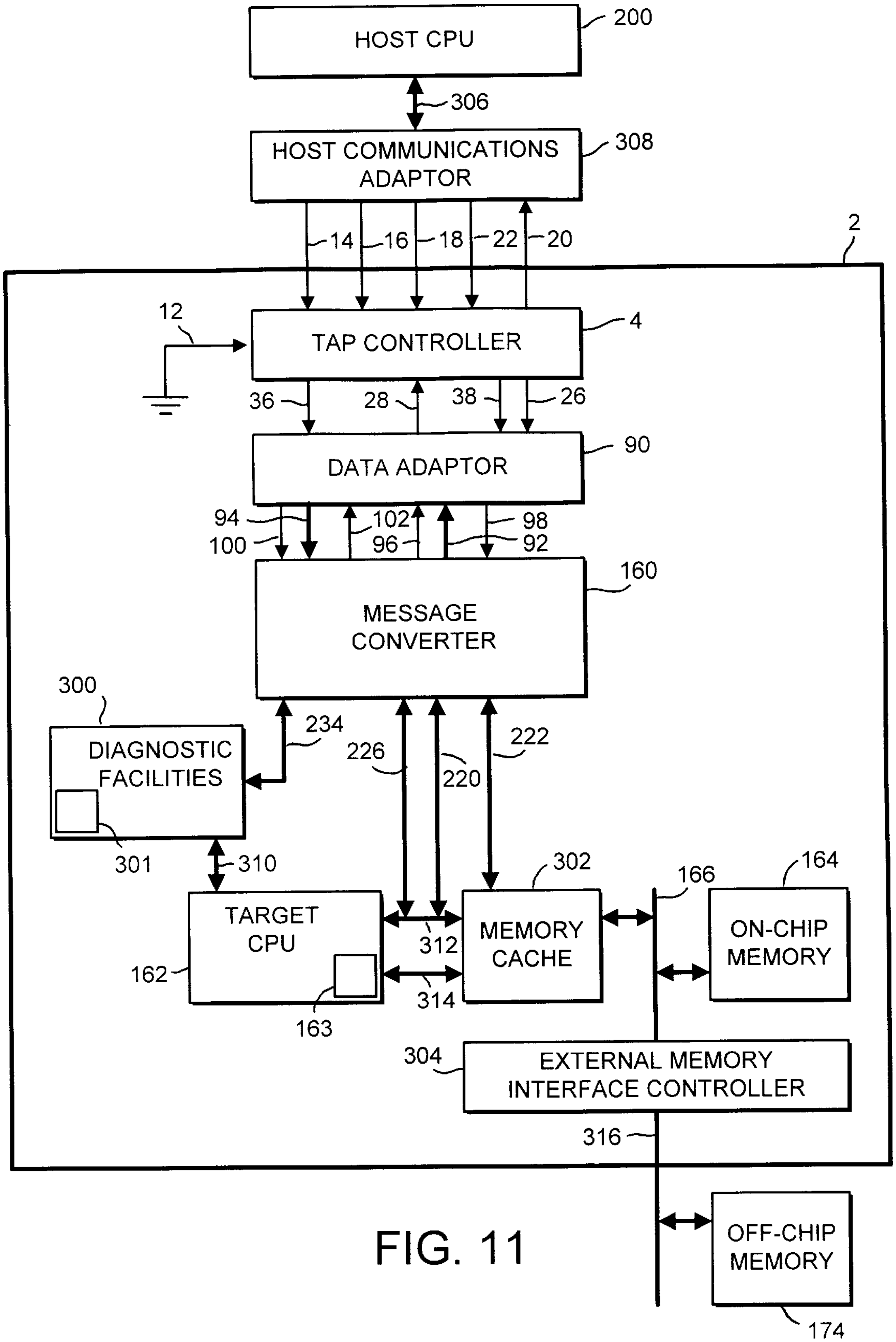
FIG. 11 illustrates in block diagram hierarchical form and implementation of the message converter of the described embodiment.

Referring to FIG. 11, there is illustrated in schematic form the interconnection between the message converter 160 of FIGS. 8 and 10, and the on-chip destination/source logic or target area, and the host CPU. As described hereinabove with reference to FIG. 5, the integrated circuit 2 comprises the TAP controller 4, the data adaptor 90, the target CPU 162 including CPU registers 163, and the on-chip memory 164. Additionally the integrated circuit 2 of FIG. 11 comprises diagnostic facilities 300 including diagnostic registers 301, a memory cache 302, an external memory interface controller 304, and the message converter 160 as described in detail in FIG. 10. In FIG. 11, it is shown that the host CPU 200 interfaces with the TAP controller 4 of the integrated circuit 2 via a host communications adaptor 308. The host communications adaptor 308 includes, in the described embodiment, the TAP controller initialiser 176, the data adaptor 180, and the memory bus adaptor 194 described in relation to FIG. 5 hereinabove. In addition the host communications adaptor 308 includes a message converter equivalent to the message converter 160 provided on the integrated circuit 2 for converting messages to and from the host CPU 200. Referring further to FIG. 11 it can be seen that the message converter 160 communicates with the diagnostic facilities 300 via the diagnostic bus 234. The diagnostic facilities 300 and target CPU 162 communicate with each other via a bus 310. The memory monitor bus 226 and memory slave bus 220 of the message converter 160 are both connected to a common bus 312 between the target CPU and the memory cache 302. Additionally the target CPU and memory cache 302 are interconnected via a CPU instruction-fetch bus 314. The memory master bus 222 on the message converter 160 is connected to the memory cache 302, which in turn is connected to the memory bus 166 of the on-chip destination/source logic. As described hereinabove with reference to FIG. 5, the memory bus 166 is connected to the on-chip memory 164. Additionally the memory bus 166 is connected to the external memory interface controller 304, which interfaces the on-chip destination/source logic memory bus 166 to an off-chip memory bus 316 which interfaces with the off-chip memory 174.

The structure of FIG. 11 can be used to implement various diagnostic procedures by transmitting messages between the on-chip destination/source logic and the host CPU.

The diagnostic bus 234 allows reading and writing to and from the diagnostic registers 301 of the diagnostic facilities 300, and also allows triggered events to be read. Control information associated with the target CPU is read from the diagnostic facilities 300. The instruction pointer and other control signals associated with the target CPU are stored in the diagnostic register 301 of the diagnostic facilities 300. The instruction pointer is continually copied into one of the diagnostic registers 301, and can be accessed by a request on the diagnostic bus 234. To look at the status of the target CPU it is necessary to look at one of the diagnostic registers 301 of the diagnostic facilities 300. The diagnostic registers 301 can store various control signals of the target CPU, for example STORE, TRAP, TAKE A TRAP, TRAP AT NEXT EXIT. These signals are communicated to the CPU via specific wires.

The host CPU may write to registers within the diagnostic facilities 300 via the diagnostic bus 234, in the same manner as the host CPU may write to memory locations within the target CPU memory space via the memory master bus 222 as discussed hereinabove. In response to the host CPU writing to the registers of the diagnostic facilities 300, triggered events may occur. Such triggered events are detected in the message converter 160 by the state machine 252 identifying a request signal associated with a reason code identifying the triggered event. In response to the request signal the state machine 252 loads into the header register 240 the reason code associated with the triggered event together with the two bits 11 identifying a triggered headed byte. The triggered header byte stored in the header register 240 is then output on the transmit data bus TXDATA to the target CPU.

As mentioned hereinabove, the target CPU can itself access the diagnostic facilities 300 via the memory monitor bus 226 and the diagnostic bus 234. Similarly, if the target CPU writes to the diagnostic facilities, and in response to such a write a triggered event occurs, then the state machine 252 will output the triggered header byte contained in the header register 240 back to the target CPU. The state machine 252 stores whether a write on the diagnostic bus 234 has been made by the target CPU or the host CPU, and returns the triggered event to the correct destination accordingly.

The message converter according to the described embodiment implemented in the environment shown in FIG. 11 enables a variety of high level diagnostic features to be supported, including boot from test access ports, hot plug insertion, and host and target synchronisation.

Thus according to the described embodiment there is provided a message converter which is inserted on an integrated circuit and can provide for communication between a host CPU and on-chip destination/source logic via a restricted pin count. Such a converter may have access to a variety of on-chip resources. Some of these may simply be monitored, others may be controlled or both monitored and controlled. Monitoring of any resource is non-intrusive, and has no impact on the performance or latency of the functionality of the chip. This is ideal for diagnostic purposes. The message converter performs the functions of interpretation of received messages, the compilation of transmit messages, and the selection or direction of information to/from the on-chip destination/source logic. The message converter operates independently of any of the on-chip functionality and is therefore non-intrusive, until or unless it is directed to perform some intrusive operation.

The diagnostic bus 234 allows reading and writing to and from the diagnostic registers 301 of the diagnostic facilities 300, and also allows triggered events to be generated. Control information associated with the target CPU is read from the diagnostic facilities 300. The instruction pointer and other control signals associated with the target CPU are stored in the diagnostic registers 301 of the diagnostic facilities 300. The instruction pointer is continually copied into one of the diagnostic registers 301, and can be accessed by a request on the diagnostic bus 234. To look at the status of the target CPU it is necessary to look at one of the diagnostic registers 301 of the diagnostic facilities 300. The diagnostic registers 301 can store various control signals of the target CPU, for example STORE, TRAP, TAKE A TRAP, TRAP AT NEXT EXIT. These signals are communicated to the CPU via specific wires.

The host CPU may write to registers with in the diagnostic facilities 300 via the diagnostic bus 234, in the same manner as the host CPU may write to memory locations within the target CPU memory space via the memory master bus 222 as discussed hereinabove. In response to the host CPU writing to the registers of the diagnostic facilities 300, triggered events may occur. Such triggered events are detected in the message converter 160 by the state machine 252 identifying a request signal associated with a reason code identifying the triggered event. In response to the request signal the state machine 252 loads into the header register 240 the reason code associated with the triggered event together with the two bits 11 identifying a triggered headed byte. The triggered header byte stored in the header register 240 is then output on the transmit data bus TXDATA to the target CPU.

As mentioned hereinabove, the target CPU can itself access the diagnostic facilities 300 via the memory monitor bus 226 and the diagnostic bus 234. Similarly, if the target CPU writes to the diagnostic facilities, and in response to such a write a triggered event occurs, then the state machine 252 will output the triggered header byte contained in the header register 240 back to the target CPU. The state machine 252 stores whether a write on the diagnostic bus 234 has been made by the target CPU or the host CPU, and returns the triggered event to the correct destination accordingly.

The message converter according to the described embodiment implemented in the environment shown in FIG. 11 enables a variety of high level diagnostic features to be supported, including boot from test access ports, hot plug insertion, and host and target synchronisation.

Thus according to the described embodiment there is provided a message converter which is inserted on an integrated circuit and can provide for communication between a host CPU and on-chip destination/source logic via a restricted pin count. Such a converter may have access to a variety of on-chip resources. Some of these may simply be monitored, others may be controlled or both monitored and controlled. Monitoring of any resource is non-intrusive, and has no impact on the performance or latency of the functionality of the chip. This is ideal for diagnostic purposes. The message converter performs the functions of interpretation of received messages, the compilation of transmit messages, and the selection or direction of information to/from the on-chip destination/source logic. The message converter operates independently of any of the on-chip functionality and is therefore non-intrusive, until or unless it is directed to perform some intrusive operation.

Referring to FIG. 11, the structure thereof may be adapted by removal of the memory cache 302 and connection of the common bus 312 and the CPU instruction-fetch bus 314 directly to the memory bus 166. Furthermore, the structure could be adapted to include an additional master, or on-chip autonomous functionality connected to the memory bus 166. Still further, the target CPU 162 may be removed, and the memory slave bus 220, the memory master bus 222, and the memory monitor bus 226 connected directly to the memory bus 166.

What is claimed is:

1. A single chip integrated circuit device comprising:

an on-chip target processor;

an on-chip bus system having a first bit width and providing a parallel path between the target processor and a local memory said bus system having address lines, data lines and at least one read/write control line;

a message converter connected to the bus system by a first set of pins equal in number to the bit width of the bus system, the message converter having a second set of pins which are less in number than in the first set of pins;

a communication path connected to the second set of pins for communicating reduced pin data across the chip boundary;

wherein the message converter comprises:

control circuitry connected to the on-chip bus system;

reduced pin data receiving circuitry for receiving messages supplied from off chip via the communication path, decoding a message identifier of each message and causing the control circuitry to operate selectively the address lines, data lines and read/write control line of the bus system in accordance with the message identifier to effect a memory access to the local memory without utilising the on-chip target processor; and data transmit circuitry for formulating messages from information received from the bus system, allocating a message identifier to each message and transmitting messages off-chip in the form of reduced pin data.

2. A single chip integrated circuit device according to claim 1, wherein the local memory is on-chip.

3. A single chip integrated circuit device according to claim 1 wherein the local memory is off-chip but connected to the bus system via on-chip memory interface circuitry.

4. A single chip integrated circuit device according to claim 1, wherein the bus system comprises separate respective read and write control lines.

5. A single chip integrated circuit device according to claim 1, wherein the second set of pins provides a communication path in the direction for the supply of messages from off chip to on-chip, and wherein there is an auxiliary set of second pins for providing a communication path in the direction for supplying messages from on-chip to off chip.

6. A single chip integrated circuit device according to claim 1, which further comprises on-chip functional circuitry connected to the on-chip target processor.

7. A single chip integrated circuit device according to claim 6, wherein the on-chip functional circuitry comprises a set of registers holding information for diagnostic purposes, said diagnostic information being supplied to the message converter via a diagnostic port of the message converter.

8. A single chip integrated circuit device according to claim 7, wherein at least one of said registers holds an instruction pointer of the target processor.

9. A single chip integrated circuit device according to claim 7, wherein at least one of said registers holds data representative of the status of the target processor.

10. A single chip integrated circuit device according to claim 1, wherein the message converter comprises a memory bus slave port connected to the on-chip bus system for allowing memory accesses initiated by the target processor to remote memory not otherwise in the address space of the target processor.

11. A single chip integrated circuit device according to claim 1, wherein the message converter comprises a memory bus master port connected to the bus system for permitting said memory accesses from off chip directed at said local memory.

12. A single chip integrated circuit device according to claim 6, wherein the message converter comprises a memory bus monitor port connected to the on-chip bus system for monitoring memory accesses initiated by the target processor.

13. An integrated circuit according to claim 1, wherein the message converter formulates said messages from information received via the bus according to a predetermined message protocol in which the message identifier is in the form of an eight bit header with two bits of the header identifying whether the message is a data write request, data read request, data read response or triggered message.

14. An integrated circuit device according to claim 13, wherein the message converter comprises decode circuitry for decoding said two bits of the eight bit header to decode the message identifier.

15. An integrated circuit according to claim 1, wherein the message converter includes length identification circuitry for identifying from said identifier the word count of each message.

16. An integrated circuit according to claim 14, wherein for messages including a memory address and a sequence of data words for loading into said memory address, the message converter comprises means for decrementing the word count on receipt of each word and for incrementing the address to provide an allocated address in respect of each data word.

17. A computer system comprising:

a single chip integrated circuit device according to any preceding claim;

an off-chip host processor; and an off-chip message converter connected to the off-chip host processor via a parallel bus and connected to the single chip integrated circuit device via the off-chip communication path.

18. A computer system according to claim 17, wherein the off-chip communication path is such that the off-chip processor can be selectively connected without interfering with the continued normal operation of the target processor.

19. A method of effecting memory access requests made by an off-chip host processor to target memory accessible by an on-chip bus system but normally lying outside the address space of the host processor, wherein:

a) the host processor formulates a memory access message including a message identifier denoting the nature of the message as a memory read and transmits the message to an on-chip message converter connected to the on-chip bus system;

b) the message converter receives the message, decodes the message identifier and effects a memory read request to the target memory, the message converter also modifying the message identifier to denote a memory response and transmitting the message identifier to the host processor with a word count including the number of data words to follow; and c) the message converter subsequently transmits data words read from said target memory to the host processor in accordance with the word count.

20. A method according to claim 19, including effecting memory access requests from on-chip functional circuitry connected to said on-chip bus system to remote memory normally lying outside the address space of the on-chip functional circuitry and within the address space of the host processor, wherein a memory access request initiated by the on-chip functional circuitry is supplied to the message converter which formulates therefrom a memory access message including a message identifier denoting the nature of the message, the message being transmitted to the off-chip host processor which decodes the message identifier and effects a memory access to its remote memory and returns a memory response including data words read from said remote memory to said on-chip message converter.

21. A method according to claim 20 where in when the message converter has transmitted the memory access message to the off-chip host processor, it is free to deal with subsequent messages or requests.

22. A method according to claim 19, which includes the step of monitoring the status of the on-chip functional circuitry without affecting its operation for determining a trigger condition and for returning a triggered message to the host processor indicating that the trigger condition has been reached.

23. A method according to claim 22, wherein the messages are formulated according to a message protocol in which the message identifier is in the form of an eight bit header with the first two bits of the header identifying whether the message is a data write request for writing data to the host memory, a data read request for reading data from the host memory, memory access response or triggered message.

24. A method according to claim 21, for use with an on-chip target processor, wherein the host processor and target processor are synchronised by the target processor dispatching a data read request accessing a memory location in the remote memory and awaiting a data read response prior to the target processor commencing further operations.

25. A single chip integrated circuit device comprising:

an on-chip target processor;

an on-chip bus system having a first bit width and providing a parallel path between the target processor and a local memory said bus system having address lines, data lines and at least one read/write control line;

a message converter connected to the bus system by a first set of pins equal in number to the bit width of the bus system, the message converter having a second set of pins which are less in number than in the first set of pins;

a communication path connected to the second set of pins for communicating reduced pin data across the chip boundary;

wherein the message converter comprises:

control circuitry connected to the on-chip bus system;

reduced pin data receiving circuitry for receiving messages supplied from off chip via the communication path, decoding a message identifier of each message and causing the control circuitry to operate selectively the address lines, data lines and read/write control line of the bus system in accordance with the message identifier to effect a memory access to the local memory without utilising the on-chip target processor;

data transmit circuitry for formulating messages from information received from the bus system, allocating a message identifier to each message and transmitting messages off-chip in the form of reduced pin data; and a memory bus slave port connected to the on-chip bus system for allowing memory accesses initiated by the target processor to remote memory not otherwise in the address space of the target processor.

26. A single chip integrated circuit device comprising:

an on-chip target processor;

an on-chip bus system having a first bit width and providing a parallel path between the target processor and a local memory said bus system having address lines, data lines and at least one read/write control line;

a message converter connected to the bus system by a first set of pins equal in number to the bit width of the bus system, the message converter having a second set of pins which are less in number than in the first set of pins;

a communication path connected to the second set of pins for communicating reduced pin data across the chip boundary;

wherein the message converter comprises:

control circuitry connected to the on-chip bus system;

reduced pin data receiving circuitry for receiving messages supplied from off chip via the communication path, decoding a message identifier of each message and causing the control circuitry to operate selectively the address lines, data lines and read/write control line of the bus system in accordance with the message identifier to effect a memory access to the local memory without utilising the on-chip target processor; and data transmit circuitry for formulating messages from information received from the bus system, said data transmit circuitry being operable to allocate a message identifier to each message, said message identifier being a modified version of the decoded message identifier, and to transmit messages off-chip in the form of reduced pin data.

27. A method of effecting memory access requests made by an off-chip host processor to target memory accessible by an on-chip bus system but normally lying outside the address space of the host processor, wherein:

a) the host processor formulates a memory access message including a message identifier denoting the nature of the message as a memory read and transmits the message to an on-chip message converter connected to the on-chip bus system;

b) the message converter receives the message, decodes the message identifier and effects a memory read request to the target memory, the message converter also modifying the message identifier to denote a memory response and transmitting the message identifier to the host processor with a word count including the number of data words to follow; and c) the message converter subsequently transmits data words read from said target memory to the host processor in accordance with the word count, wherein memory access requests are effected from on-chip functional circuitry connected to said on-chip bus system to remote memory normally lying outside the address space of the on-chip functional circuitry and within the address space of the host processor, wherein a memory access request initiated by on-chip functional circuitry is supplied to the message converter which formulates therefrom a memory access message including a message identifier denoting the nature of the message, the message being transmitted to the off-chip host processor which decodes the message identifier and effects a memory access to its remote memory and returns a memory response including data words read from said remote memory to said on-chip message converter.

28. A method of effecting memory access requests made by an off-chip host processor to target memory accessible by an on-chip bus system but normally lying outside the address space of the host processor, wherein:

a) the host processor formulates a memory access message including a message identifier denoting the nature of the message as a memory read and transmits the message to an on-chip message converter connected to the on-chip bus system;

b) the message converter receives the message, decodes the message identifier and effects a memory read request to the target memory, the message converter also modifying the message identifier to denote a memory response and transmitting the message identifier to the host processor with a word count including the number of data words to follow; and c) the message converter subsequently transmits data words read from said target memory to the host processor in accordance with the word count, wherein memory access requests are effected from on-chip functional circuitry connected to said on-chip bus system to remote memory normally lying outside the address space of the on-chip functional circuitry and within the address space of the host processor, wherein a memory access request initiated by on-chip functional circuitry is supplied to the message converter which formulates therefrom a memory access message including a message identifier denoting the nature of the message, the message being transmitted to the off-chip host processor which decodes the message identifier and effects a memory access to its remote memory and returns a memory response including data words read from said remote memory to said on-chip message converter, the message converter being free to deal with subsequent messages or requests when the message converter has transmitted the memory access message to the off-chip host processor, and wherein the host processor and target processor are synchronised by the target processor dispatching a data read request accessing a memory location in the remote memory and awaiting a data read response prior to the target processor commencing further operations.

* * * * *